United States Patent (12)
Gibson et al.

(10) Patent No.: US 10,411,153 B2
(45) Date of Patent: Sep. 10, 2019

(54) TILED SOLAR MODULE REPAIR PROCESS

(71) Applicant: SOLARIA CORPORATION, Fremont, CA (US)

(72) Inventors: Kevin R. Gibson, Redwood City, CA (US); Aureo Parilla, Hayward, CA (US); Manny Castro, San Jose, CA (US)

(73) Assignee: SOLARIA CORPORATION, Fremont, CA (US)

( * ) Notice: Subject to any disclaimer, the term of this patent is extended or adjusted under 35 U.S.C. 154(b) by 244 days.

(21) Appl. No.: 15/621,991

(22) Filed: Jun. 13, 2017

(65) Prior Publication Data

US 2017/0301821 A1 Oct. 19, 2017

Related U.S. Application Data

(63) Continuation-in-part of application No. 14/609,307, filed on Jan. 29, 2015.
(Continued)

(51) Int. Cl.
H01L 31/18 (2006.01)
H01L 31/02 (2006.01)
(Continued)

(52) U.S. Cl.
CPC ........ H01L 31/188 (2013.01); H01L 31/0201 (2013.01); H01L 31/044 (2014.12);
(Continued)

(58) Field of Classification Search
CPC ........................... H01L 31/188; H01L 31/044; H01L 31/0504; H01L 31/0201; H02S 40/44; Y02E 10/50
See application file for complete search history.

(56) References Cited

U.S. PATENT DOCUMENTS 4,419,530 A * 12/1983 Nath ............... H01L 31/022425
136/244
2010/0240153 A1* 9/2010 Tabe ..................... H01L 31/188
438/4

(Continued)

FOREIGN PATENT DOCUMENTS

EP 2 284 908 A1 2/2011
KR 10-2011-0031071 A 3/2011
KR 10-2013-0027900 A 3/2013

OTHER PUBLICATIONS

International Search Report and Written Opinion for International Patent Application No. PCT/US2016/015800 dated May 12, 2016.

Primary Examiner — Yasser A Abdelaziez

(57) ABSTRACT

In an example, a method includes providing a photovoltaic string comprising a plurality of from 2 to 45 strips, each of the plurality of strips being configured in a series arrangement with each other, each of the plurality of strips being coupled to another one of the plurality of strips using an electrically conductive adhesive (ECA) material, detecting at least one defective strip in the photovoltaic string, applying thermal energy to the ECA material to release the ECA material from a pair of photovoltaic strips to remove the defective photovoltaic strip, removing any residual ECA material from one or more good photovoltaic strip, aligning the photovoltaic string without the damaged photovoltaic strip, and a replacement photovoltaic strip that replaces the defective photovoltaic strip, and curing a reapplied ECA material on the replacement photovoltaic strip to provide the photovoltaic string with the replacement photovoltaic strip.

20 Claims, 28 Drawing Sheets

Related U.S. Application Data

(60) Provisional application No. 62/349,541, filed on Jun. 13, 2016.

(51) Int. Cl.
*H01L 31/05* (2014.01)
*H02S 40/44* (2014.01)
*H01L 31/044* (2014.01)

(52) U.S. Cl.
CPC .......... *H01L 31/0504* (2013.01); *H02S 40/44* (2014.12); *Y02E 10/50* (2013.01)

(56) References Cited

U.S. PATENT DOCUMENTS

| | | | |
|---|---|---|---|
| 2011/0079263 A1 | 4/2011 | Avrutsky | |
| 2012/0180843 A1 | 7/2012 | Park | |
| 2014/0158180 A1* | 6/2014 | Ishii | ................ H01L 31/022441 136/244 |
| 2014/0190546 A1* | 7/2014 | Fukumochi | ........... H01L 31/188 136/244 |
| 2016/0163910 A1* | 6/2016 | Gonzalez | ............ H01L 31/0504 438/80 |

* cited by examiner

FIG. 4
FIG. 5
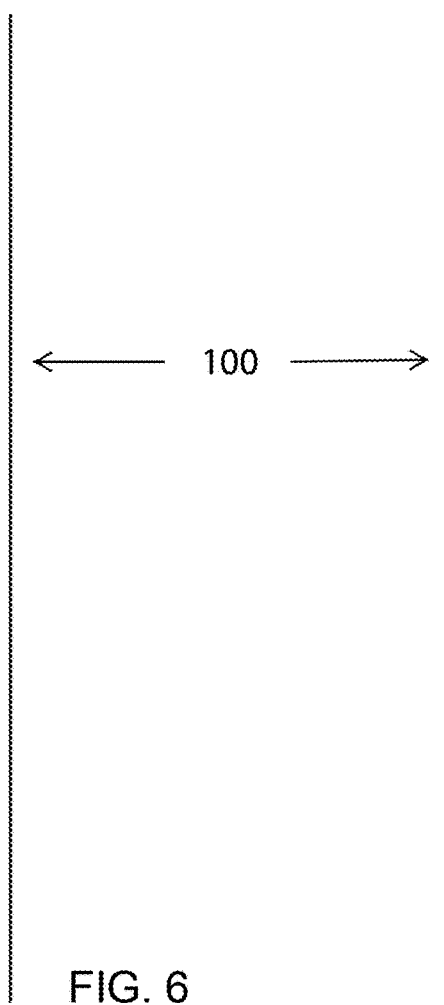
FIG. 6          FIG. 7

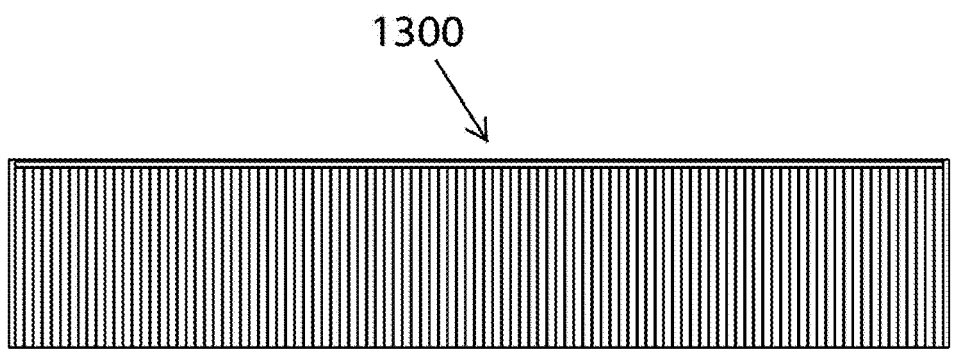
FIG. 15
FIG. 16
FIG. 17

2100

TILED SOLAR MODULE REPAIR PROCESS

CROSS-REFERENCES TO RELATED APPLICATIONS

This application is a non-provisional of U.S. Provisional Application No. 62/349,541, filed Jun. 13, 2016, and this application also claims priority to U.S. patent application Ser. No. 14/609,307, filed Jan. 29, 2015, which is incorporated by reference herein for all purposes.

BACKGROUND OF THE INVENTION

The present invention is directed to photovoltaic systems and manufacturing processes and apparatus thereof In particular, the present invention provides an apparatus and method for using a replacement process of a selected solar strip, among a plurality of strips, for a high-density solar module.

As the population of the world has increased, industrial expansion has led to a corresponding increased consumption of energy. Energy often comes from fossil fuels, including coal and oil, hydroelectric plants, nuclear sources, and others. As merely an example, the International Energy Agency projects further increases in oil consumption, with developing nations such as China and India accounting for most of the increase. Almost every element of our daily lives depends, in part, on oil, which is becoming increasingly scarce. As time further progresses, an era of "cheap" and plentiful oil is coming to an end. Accordingly, other and alternative sources of energy have been developed.

In addition to oil, we have also relied upon other very useful sources of energy such as hydroelectric, nuclear, and the like to provide our electricity needs. As an example, most of our conventional electricity requirements for home and business use comes from turbines run on coal or other forms of fossil fuel, nuclear power generation plants, and hydroelectric plants, as well as other forms of renewable energy. Often times, home and business use of electrical power has been stable and widespread.

Most importantly, much if not all of the useful energy found on the Earth comes from our sun. Generally, plant life on the Earth achieves life using photosynthesis processes from sunlight. Fossil fuels such as oil were also developed from biological materials derived from energy associated with the sun. For life on the planet Earth, the sun has been our most important energy source and fuel for modern day solar energy.

Solar energy possesses many desirable characteristics; it is renewable, clean, abundant, and often widespread. Certain technologies developed often capture solar energy, concentrate it, store it, and convert it into other useful forms of energy.

Solar panels have been developed to convert sunlight into energy. For example, solar thermal panels are used to convert electromagnetic radiation from the sun into thermal energy for heating homes, running certain industrial processes, or driving high-grade turbines to generate electricity. As another example, solar photovoltaic panels are used to convert sunlight directly into electricity for a variety of applications. Solar panels are generally composed of an array of solar cells, which are interconnected to each other. The cells are often arranged in series and/or parallel groups of cells in series. Accordingly, solar panels have great potential to benefit our nation, security, and human users. They can even diversify our energy requirements and reduce the world's dependence on oil and other potentially detrimental sources of energy.

Although solar panels have been used successfully for certain applications, there are still certain limitations. Solar cells are often costly. Depending upon the geographic region, there are often financial subsidies from governmental entities for purchasing solar panels, which often cannot compete with the direct purchase of electricity from public power companies. Additionally, the panels are often composed of costly photovoltaic silicon bearing wafer materials, which are often difficult to manufacture efficiently on a large scale, and sources can be limited.

Therefore, it is desirable to have novel system and method for manufacturing solar panels.

BRIEF SUMMARY OF THE INVENTION

The present invention is directed to photovoltaic systems and manufacturing processes and apparatus thereof. In particular, the present invention provides an apparatus and method for using a replacement process of a selected solar strip, among a plurality of strips, for a high-density solar module. There are other embodiments as well.

In an embodiment, a method of manufacturing a solar module apparatus includes providing a photovoltaic string, the photovoltaic string comprising a plurality of from 2 to 45 strips, each of the plurality of strips being configured in a series arrangement with each other, each of the plurality of photovoltaic strips having a substantially similar width and substantially similar length, the photovoltaic string comprising a first bus bar and a second bus bar, each of the plurality of strips being coupled to another one of the plurality of strips using an electrically conductive adhesive (ECA) material to mechanically connect the plurality of strips together, detecting the presence of at least one defective strip in the photovoltaic string, applying thermal energy to the ECA material to change a state of the ECA material to release the ECA material from a pair of the photovoltaic strips to remove the defective photovoltaic strip, removing any residual ECA material from one or more good photovoltaic strip that was adjacent to the defective photovoltaic strip in the string, aligning the photovoltaic string without the damaged photovoltaic strip, and a replacement photovoltaic strip that replaces the defective photovoltaic strip, and curing a reapplied ECA material on the replacement photovoltaic strip to provide the photovoltaic string with the replacement photovoltaic strip.

In an embodiment, the method includes aligning a first portion of the photovoltaic string to an alignment member, applying the ECA material on the replacement photovoltaic strip, aligning a second portion of the photovoltaic string to the replacement photovoltaic strip, and curing the reapplied ECA material.

The ECA material may be a thermosetting acrylate adhesive, and the ECA may be a heat cured adhesive that is loaded with conductive metal particles. The thermal energy may be provided by conduction, convention, or radiation to a temperature ranging from 150 to 300 degrees Celsius, and in an embodiment heat may be provided by conduction using a heat source that is heated to from 150 to 250 degrees Celsius.

In an example, each of the photovoltaic strips is derived from separating a solar cell into five strips of similar size and shape.

In an example, the defective photovoltaic strip has a defect consisting of at least one of a crack, a broken section, a bad electrical interconnect, a defective photovoltaic material, or short or open circuit.

In an example, detecting the presence of the at least one defective strip includes applying DC power to the first bus bar and the second bus bar to initiate an emission of electromagnetic radiation from each of the photovoltaic strips, capturing an image of the photovoltaic string to identify at least one of the photovoltaic strips that has a darker image and therefore a defective photovoltaic strip than a good photovoltaic strip to identify the defective photovoltaic strip.

In an example, the image is captured in an electromagnetic radiation range including infra-red.

In an example, the good photovoltaic strip emits a substantially even image that has been captured and is homogeneous along an entirety of a surface region of the good photovoltaic strip. The DC power may be a voltage ranging from 10 to 50 Volts and a current ranging from 0.5 to 10 Amps.

In an example, the photovoltaic string is configured with a plurality of photovoltaic strings in a module before a lamination process.

In an example, the thermal energy is provided selectively to localize heat to the ECA material, while maintaining other portions of the strip substantially free from thermal energy.

In an example, after the thermal energy is applied to the ECA, mechanical force is applied to a joint which is bonded by the ECA material to mechanically separate the defective strip from a portion of the string that includes non-defective strips.

In an example, the portion of the string that includes non-defective strips is retained in a fixture, and the defective strip is exposed by an orifice of the fixture.

In an example, the thermal energy is applied to the joint by placing the joint in contact with a heated structure.

In an example, the mechanical force is a force moment that is applied by rotating the portion of the string that includes non-defective strips relative to the defective strip.

In an example, the replacement strip is an end strip of a second string portion comprising a plurality of non-defective strips.

In an example, the ECA bonds an upper surface of a first string to a backside surface of a second string in an overlapped joint.

In an example, a solar module apparatus is provided. The apparatus has a plurality of strings, each of the plurality of strings being configured in a parallel electrical arrangement with each other and a plurality of photovoltaic strips forming each of the plurality of photovoltaic strings. The apparatus has a first end termination configured along a first end of each of the plurality of strings and a second end termination configured along a second end of each of the plurality of strings. The module has an equivalent diode device configured between the first end termination and the second end termination such that one of the plurality of photovoltaic strips associated with one of the plurality of strings when shaded causes the plurality of strips ("Shaded Strips") associated with the one of the strings to cease generating electrical current from application of electromagnetic radiation, while a remaining plurality of strips, associated with the remaining plurality of strings, each of which generates a current that is substantially equivalent to an electrical current while the Shaded Strips are not shaded, and the equivalent diode device between the first terminal and the second terminal for the plurality of strips is configured to turn-on to bypass electrical current through the equivalent diode device such that the electrical current that was bypassed traverses the equivalent diode device coupled to the plurality of strips that are configured parallel to each other.

Many benefits can be achieved by ways of the present invention. As an example, the present module can be made using conventional processes and materials. Additionally, the present module is more efficient than conventional module designs. Furthermore, the present module, and related techniques provides for a more efficient module usage using bypass diodes configured with multiple zones of solar cells. Depending upon the example, there are other benefits as well.

A further understanding of the nature and advantages of the present invention may be realized by reference to the remaining portions of the specification and the drawings.

BRIEF DESCRIPTION OF THE DRAWINGS

FIG. 4 is a top view thereof;

FIG. 5 is a bottom view thereof;

FIG. 6 is a first side view thereof;

FIG. 7 is a second side view thereof;

FIGS. 13-17 are illustrations of a center photovoltaic strip according to an example of the present invention;

DETAILED DESCRIPTION OF THE INVENTION

Figure 1:
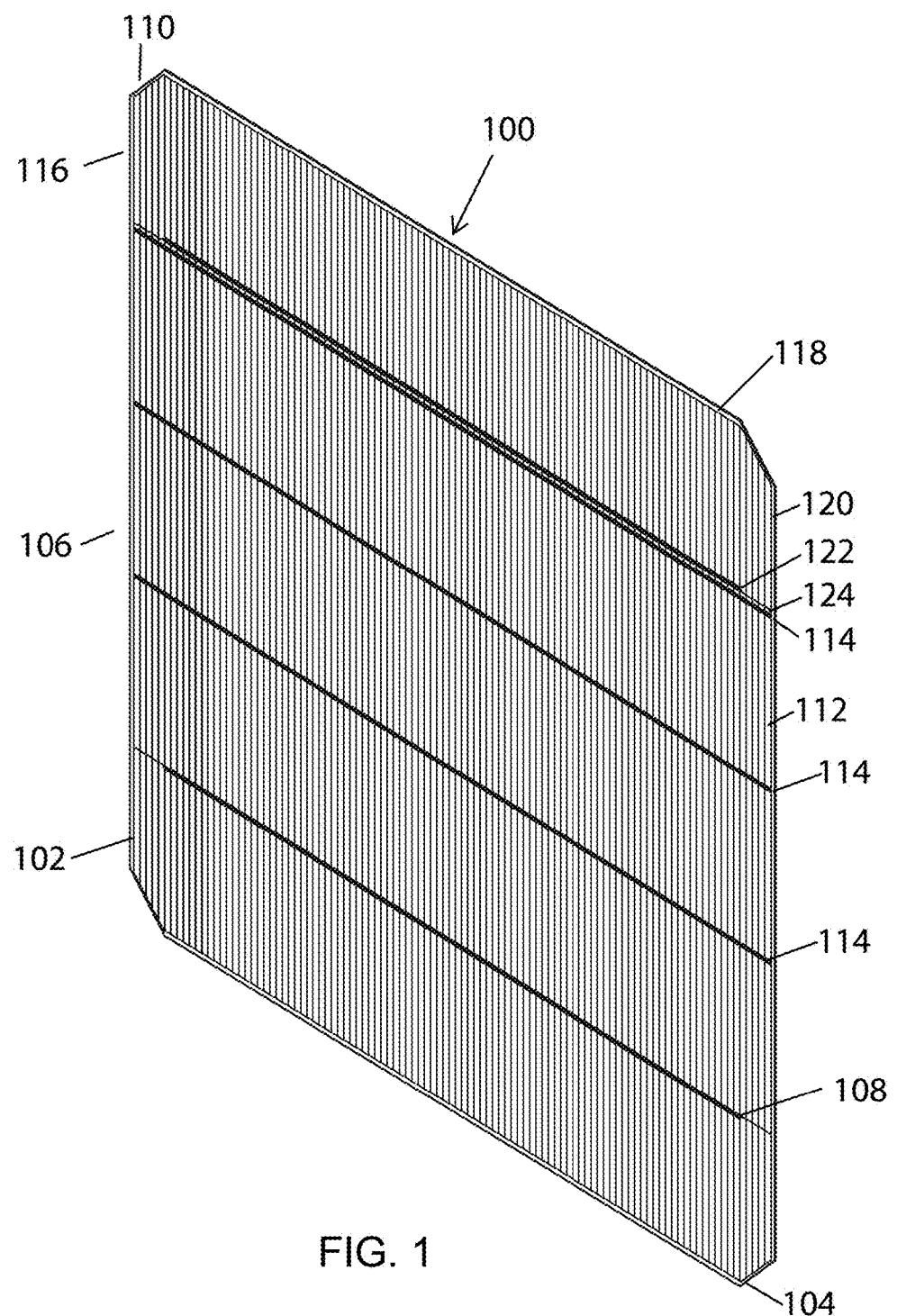
FIG. 1 is a front perspective view of a solar cell article according to an example of the present.

The present invention is directed to photovoltaic systems and manufacturing processes and apparatus thereof. There are other embodiments as well.

Embodiments of the present invention provide system and methods for manufacturing high density solar panels. Embodiments of the present invention use overlapped or tiled photovoltaic strip elements to increase the amount of photovoltaic material, thereby increasing an amount of power, while reducing an amount of series resistance losses in the solar panel. It is noted that specific embodiments are shown for illustrative purposes, and represent examples. One skilled in the art would recognize other variations, modifications, and alternatives.

Although orientation is not a part of the invention, it is convenient to recognize that a solar module has a side that faces the sun when the module is in use, and an opposite side that faces away from the sun. Although, the module can exist in any orientation, it is convenient to refer to an orientation where "upper" or "top" refer to the sun-facing side and "lower" or "bottom" refer to the opposite side. Thus, an element that is said to overlie another element will be closer to the "upper" side than the element it overlies.

While the following is a complete description of specific embodiments of the invention, the description should not be taken as limiting the scope of the invention as defined by the claims.

In an example, the present invention provides a method of manufacturing a solar module, including a repair process. In an example, one of the limitations of conventional cells is an inability to perform rework by replacing strings when a photovoltaic cell or strip is broken. It is not unusual in standard manufacturing for a cell or strip to crack in a string. In an example, Technicians use a soldering iron to release ribbon wires from a broken cell. They are then able to insert a new cell and then re-solder the ribbon wires. Thus they have repaired a string.

A feature of strings according to embodiments of the present disclosure is the use of "Electrically Conductive Adhesive" (ECA). The ECA is a cured adhesive polymer formulation that is highly loaded with conductive metal particles. In some embodiments, the conductive metal is silver. The ECA may be a thermosetting acrylate adhesive. The adhesive may have may be modified with one or more hardening components such as epoxy, phenol-formaldehyde, urea-formaldehyde, etc., that provide hardness and bonding strength. In an example, the ECA is a low temperature cure one part adhesive.

Polymers are generally categorized as thermoplastic polymers and thermosetting polymers. Thermoplastic polymers are typically melt processed, and solidify when they are cooled. When a solidified thermoplastic polymer is exposed to heat, it melts, after which it can be re-formed into a new shape and solidified again by cooling. Therefore, thermoplastic polymers can be processed multiple times by melting and solidifying.

Thermosetting polymers form cross-links between polymer chains when they are cured. These cross-links are typically promoted by a chemical reaction, so that the thermosetting polymer sets, or cures, in a permanent fashion. Because the polymer molecules in a thermosetting polymer are bonded to one another in the cured state, they do not typically return to a viscous state when exposed to heat. Many thermosetting polymer systems, such as heat cured phenolics, will oxidize when exposed to temperature without softening. Thermosetting polymers do not melt after they are set.

Solder is similar to a thermoplastic resin in that after it is applied, it can be melted when heat is applied a second time. Conventional bonds between solar cells are implemented using solder, so conventional solar assemblies can be reworked by melting and re-applying solder to the cells. However, because a thermosetting ECA that has been cured will not melt when exposed to elevated temperatures, rework processes available to soldered photovoltaic assemblies are not available to photovoltaic assemblies that use an ECA.

Conventionally, thermosetting polymers are removed using chemical solvents or mechanical removal processes. However, mechanical removal presents substantial risk of damaging sensitive materials in a photovoltaic assembly, and require high levels of precision to effectively remove relatively thin and precisely located polymer bonds. Therefore, cycle times for purely mechanical removal techniques are too long to be economically feasible. Chemical solvents are difficult to apply to the limited areas involved with defective strip replacement, and are difficult, expensive and dangerous to handle, as well as carrying the risk of damaging other materials in an assembled string. Therefore, purely mechanical and chemical based rework processes are not economically feasible.

In an example, a method according to the present disclosure provides a way to repair the string made with ECA. In an example, the method includes removing a defective cell from a string and replacing it with a good cell. The inventors of the present disclosure have discovered that while certain thermosetting ECAs cannot be melted, they will soften with temperature sufficient to facilitate an economically feasible rework process, which is unexpected. While the ECA is soft, mechanical force can be applied to bend the string in a controlled manner, such that the mechanical force breaks the bond between the cells. If the force is applied correctly, then the broken cell can be removed without damaging the other cells in the string.

In an example, temperature is a key component to removing a damaged cell or string. If the temperature is too low, the ECA will not soften enough and there is a risk that cells (either the broken one or good ones) will break when mechanical force is applied to a string. If excessive thermal energy is applied to an ECA, then the ECA may undergo a chemical reaction which could negatively affect the adjacent cells to the cell that is being repaired. Therefore, embodiments of the present disclosure include exposing an ECA to a temperature between 150 C to 200 C Temperatures substantially above this range risk causing damage, while temperatures below this range may not soften the ECA adequately to facilitate removal. Typical solder melt temperatures for solders that provide sufficient mechanical and electrical properties to connect strips are in the range of 250 C, which carries additional risks of damaging materials and causing injury compared to the ECA softening temperatures of 150 C to 200 C.

In an example, the method also includes a reassembly process of configuring a replacement cell or strip into the disassembled string. In an example, residual ECA is removed from the good strips at both ends of where the broken strip was removed. ECA removal may be performed with a solvent such as isopropyl alcohol (IPA) and an applicator. In an example, ECA is applied to an end of the string that has an exposed bus bar and is applied to the replacement strip. In an example, the method uses a semi-automatic dispensing system to control the location and volume of adhesive that is dispensed. In an example, two separated portions of the original string and the new replacement cell are re-assembled into a continuous string. In an example in which the defective strip is located at the end of a string, a single separated portion is present.

In an example, one or more separated portion is placed in a fixture to maintain the overall string length, the cell-to-cell spacing, and the overlap between strips. In an example, the fixture facilitates a +/−50 micron tolerance on the cell pitch. In an example, the new or replacement strip in the string is heated to a temperature that will cure the ECA within a predetermined time. Typically, the temperature is between 120 C and 150 Degrees Celsius. In an example, the other original ECA connections not associated with the replaced strip can be reheated to the curing temperature without any adverse effects. Of course, there can be other variations, modifications, and alternatives.

FIG. 1 is a front perspective view of a solar cell article according to an example of the present disclosure. This diagram is merely an example, and should not unduly limit the scope of the claims herein. One of ordinary skill in the art would recognize other variations, modifications, and alternatives. A solar cell 100 is shown. The solar cell 100 has a substrate member having a surface region. The surface region is an aperture region exposing photovoltaic material. In an example, the photovoltaic material can be silicon, polycrystalline silicon, single crystalline silicon, or other photovoltaic materials.

In an example, the cell 100 has the surface region comprising a spatial region and a backside region. The cell has a first end strip 102 comprising a first edge region 104 and a first interior region 106 as provided on the spatial region. In an example, the first interior region 106 comprises a first bus bar 108, while the first edge region on the spatial region has no bus bar. In an example, the first end strip has an off cut 110 on each corner. Each of the off cuts 110 is about 45 degrees in angle, and has a flat edge abutting a pair of edges at ninety degrees from each other, as shown.

After the first bus bar 108, the solar cell has a plurality of strips provided on the spatial region. As shown, each of the strips 112 has a bus bar 114 along an edge furthest away from the first bus bar 108. Each of the strips 112 is substantially rectangular in shape, and can be configured with edges at ninety degrees from each other.

In an example, the cell 100 has a second end strip 116 comprising a second edge region 118 and a second interior region 120. In an example, the second interior region 120 comprises a second bus bar 122 such that the second bus bar and the bus bar 114 from one of the plurality of strips forms a gap defining a scribe region 124. In an example, the second edge region 118 comprises no bus bar.

In an example, the first end strip 102, the plurality of strips 112, and the second end strip 116 are arranged in parallel to each other and occupy the spatial region such that the first end strip, the second end strip, and the plurality of strips consists of a total number of five (5) strips.

Figure 2:
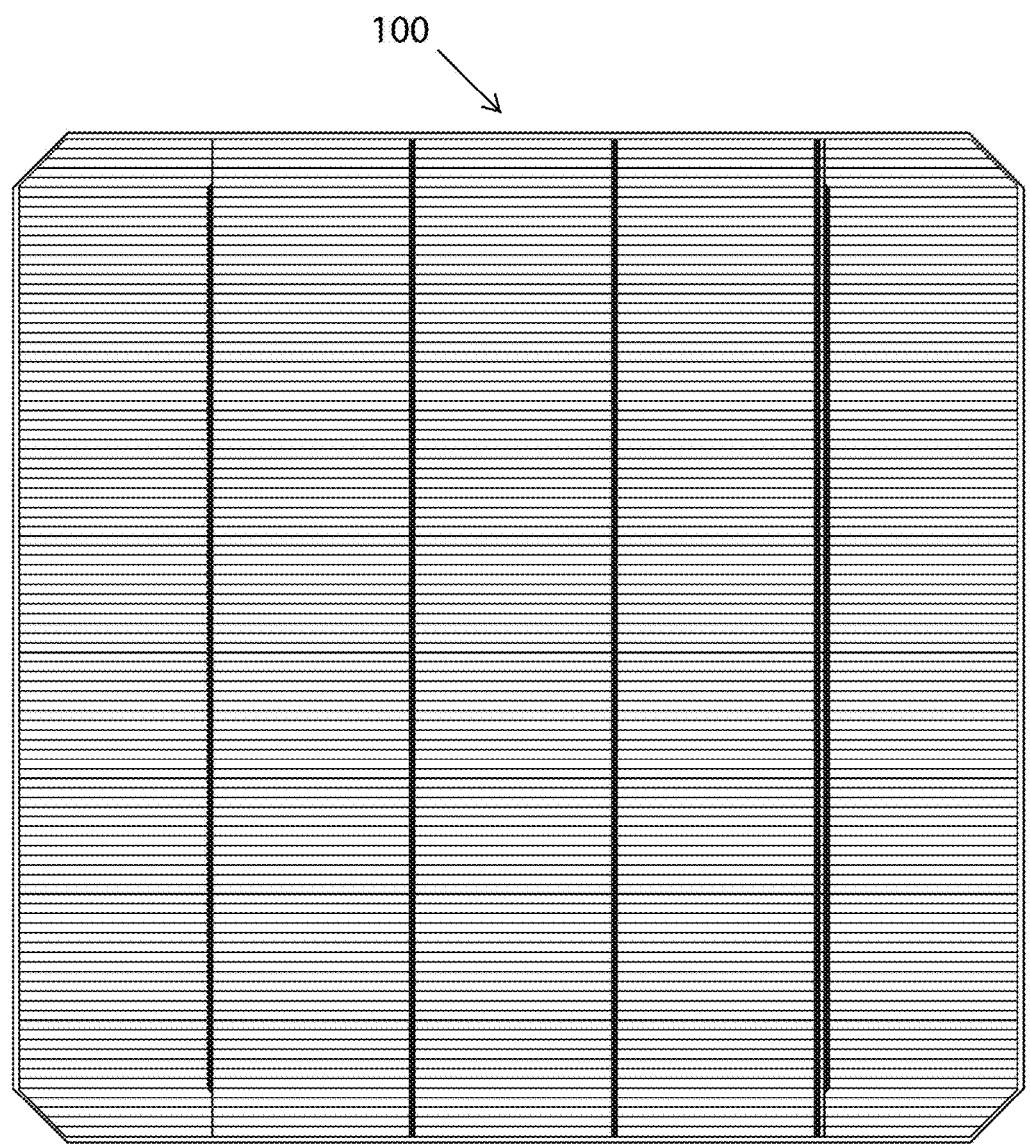
FIG. 2 is a front view thereof.
Figure 3:
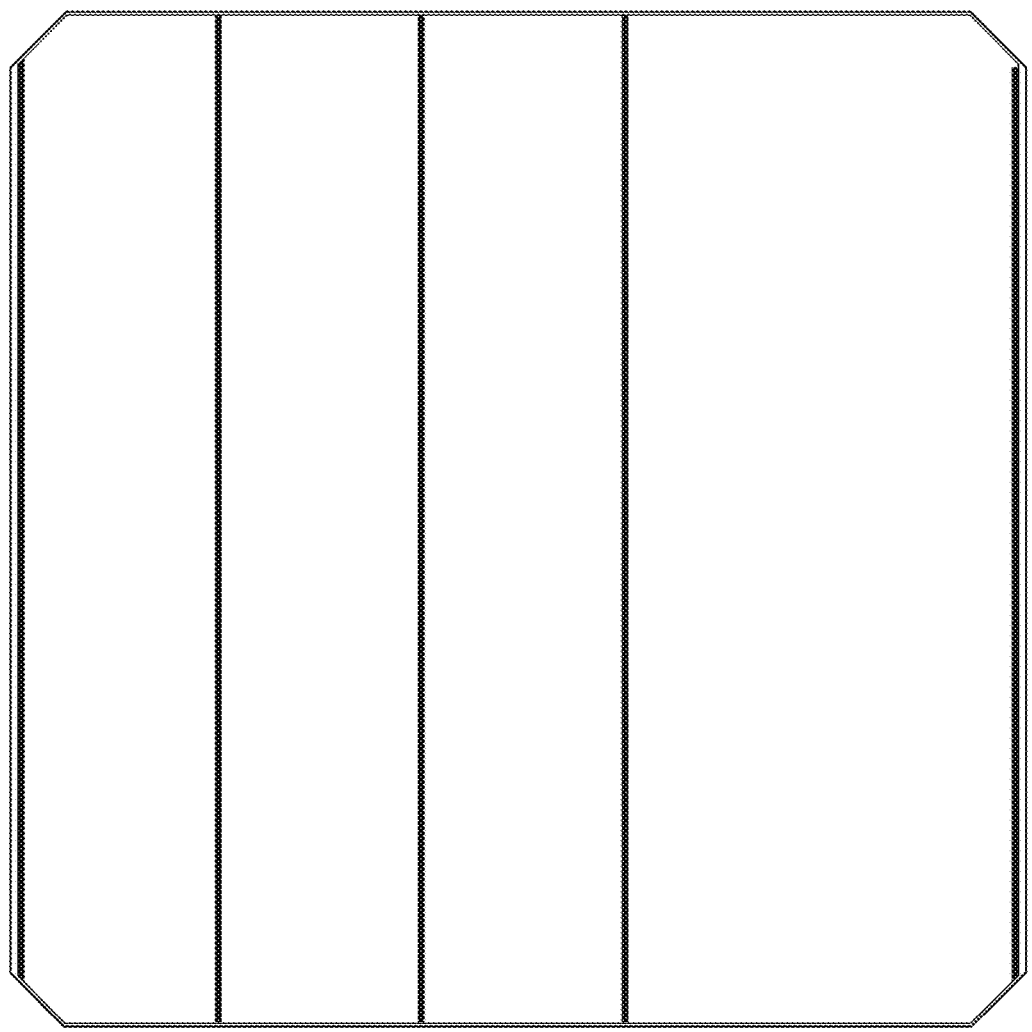
FIG. 3 is a back view thereof.
Figure 8:
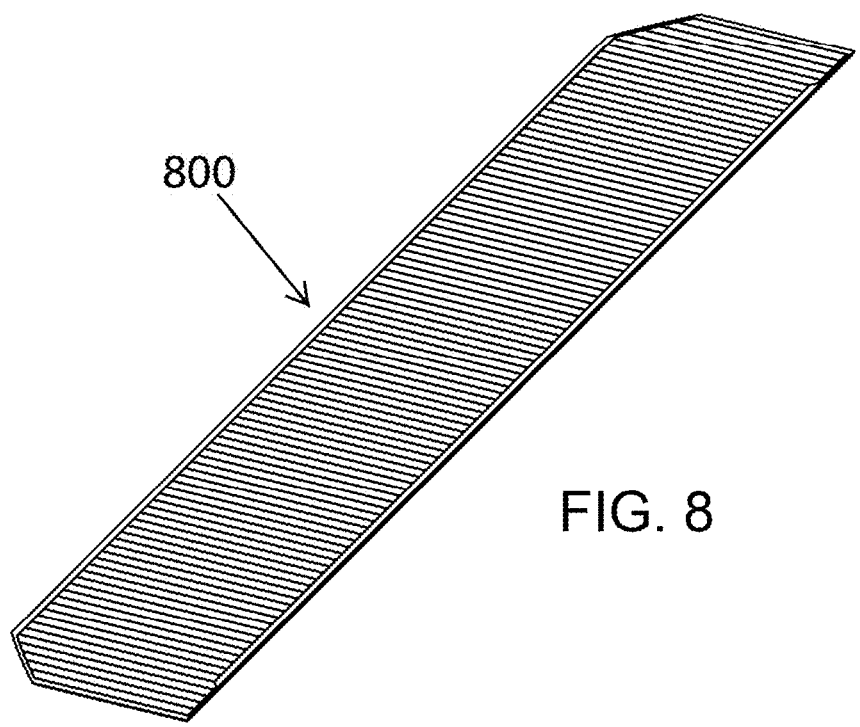
FIGS. 8-12 are illustrations of an edge photovoltaic strip according to an example of the present invention.
Figure 9:
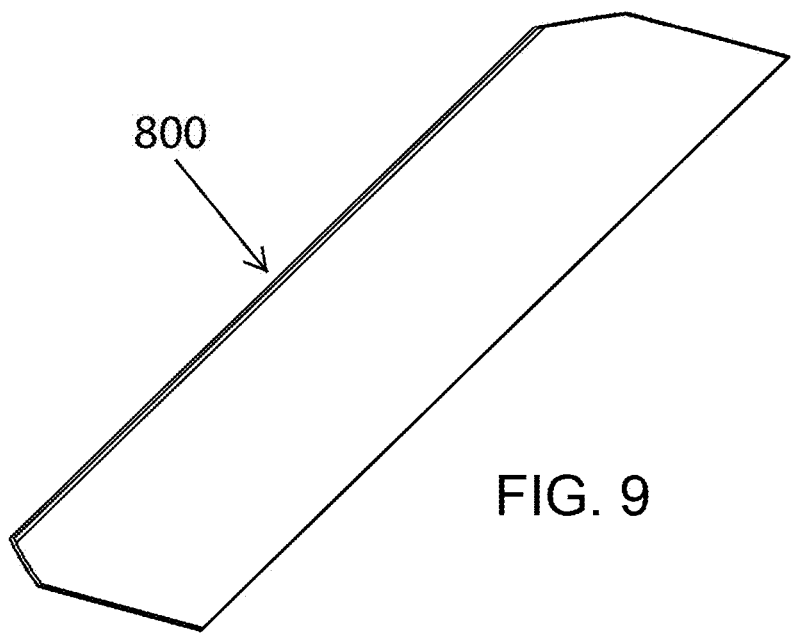
Figure 10:
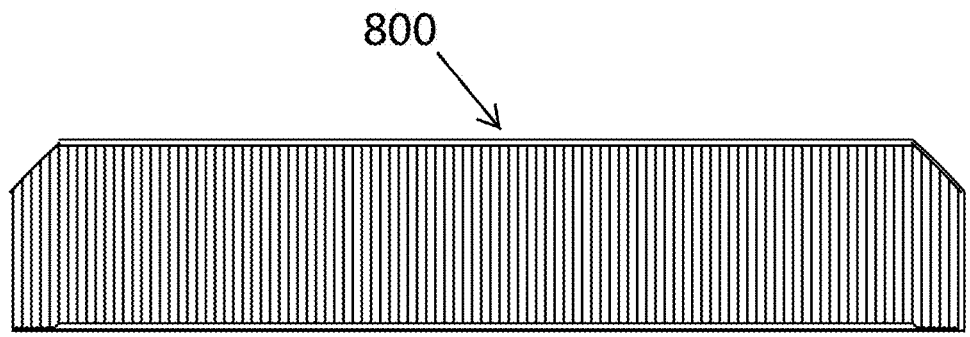
Figure 11:
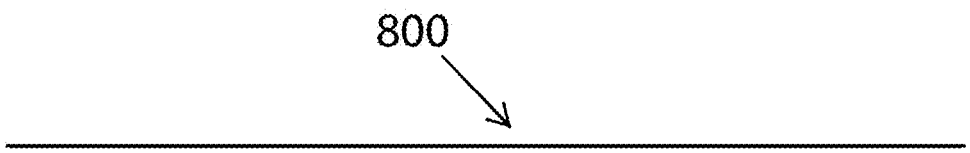
Figure 12:
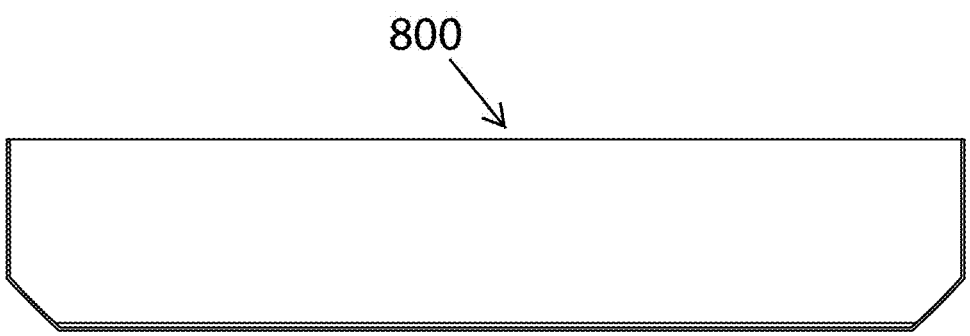
Figure 13:
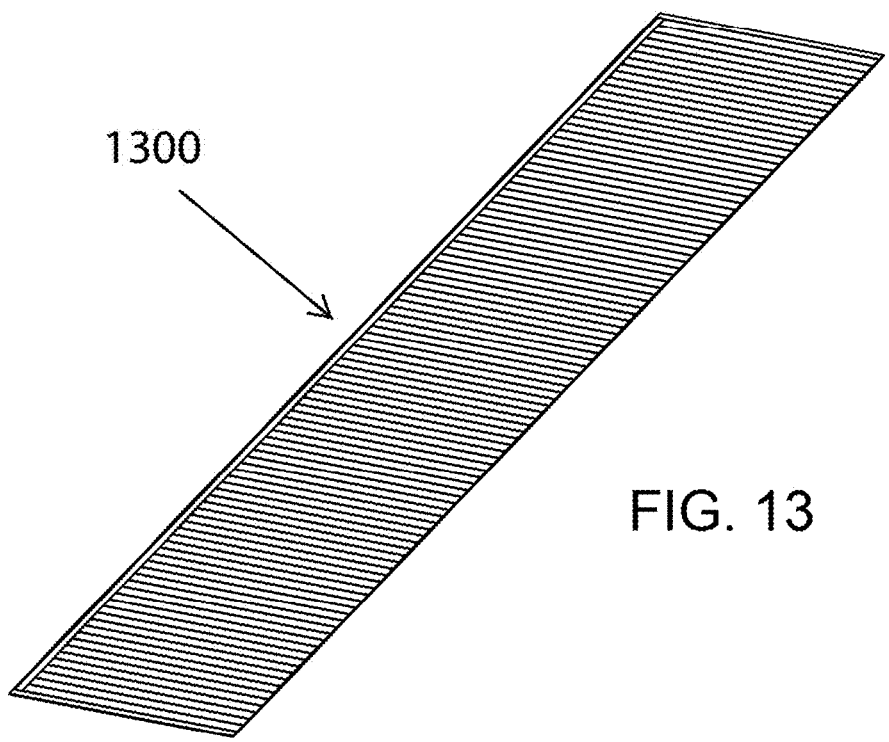
Figure 14:
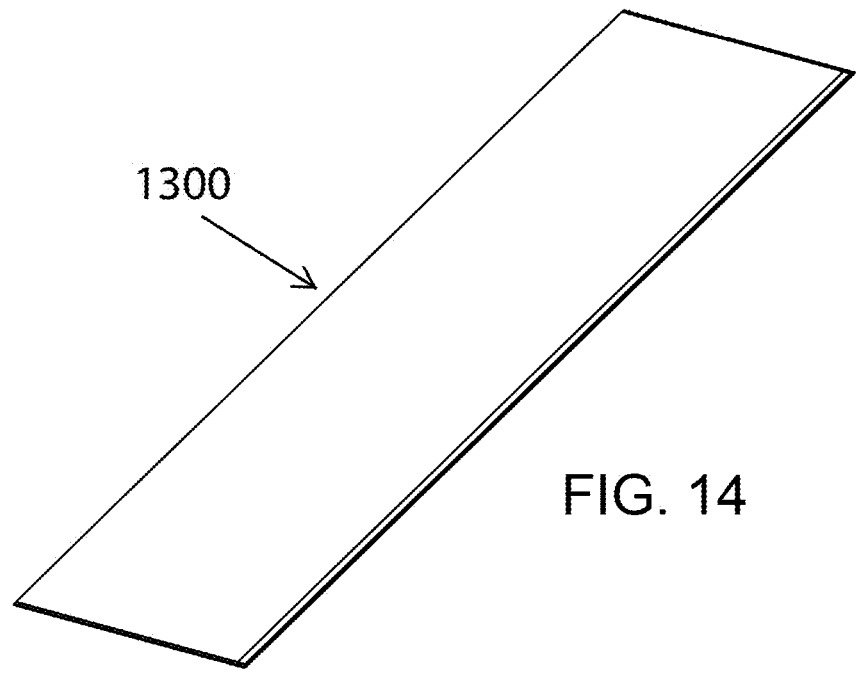

In an example, the backside region 126 comprises the second end strip 116 comprising the second edge region 118. In an example, the second edge region 118 has a second backside bus bar 126 such that the second backside bus bar 126 and the second bus bar 122 are provided between photovoltaic material of the second end strip. FIG. 2 is a front view thereof. FIG. 3 is a back view thereof. FIG. 4 is a top view thereof. FIG. 5 is a bottom view thereof. FIG. 6 is a first side view thereof. FIG. 7 is a second side view thereof.

FIGS. 8-12 are illustrations of an edge photovoltaic strip 800 according to an example of the present invention.

FIGS. 13-17 are illustrations of a center photovoltaic strip 1300 according to an example of the present invention.

Figure 18:
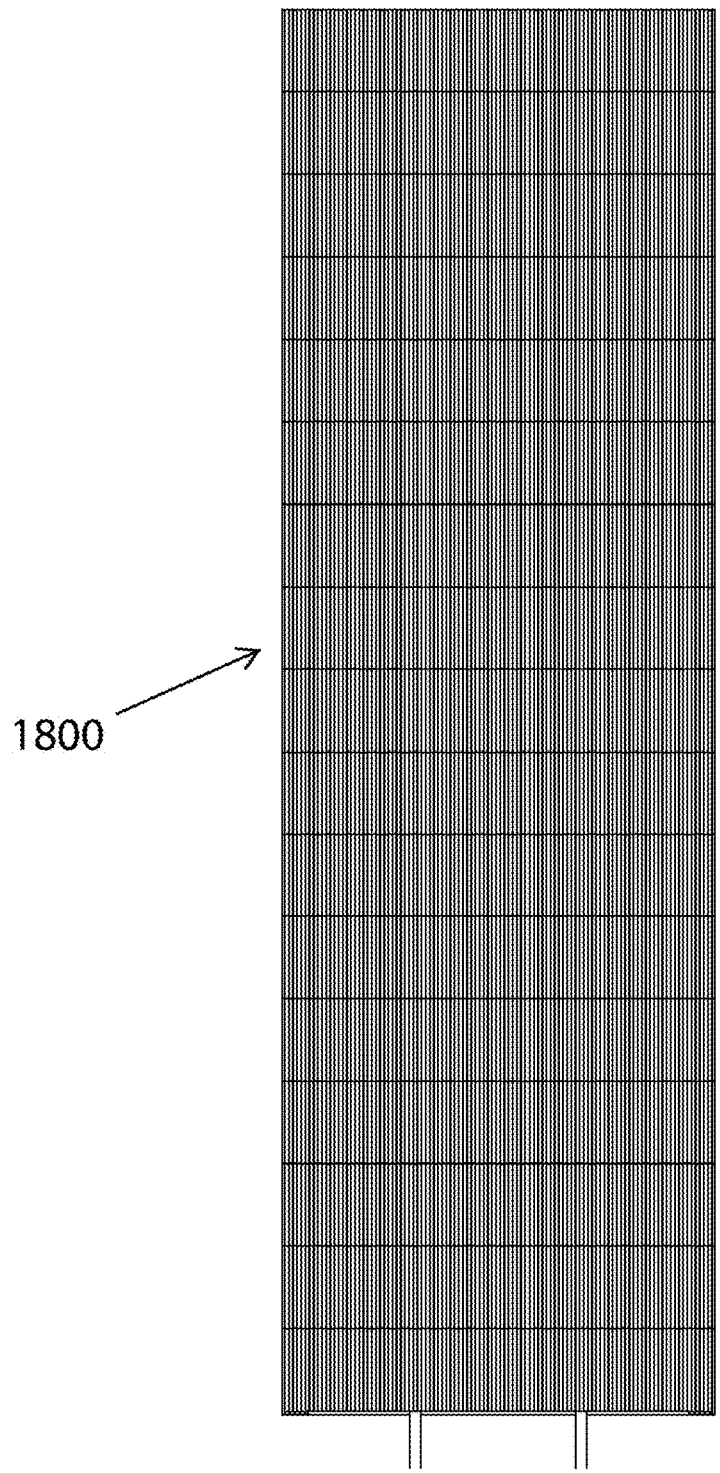
FIGS. 18-20 illustrate a photovoltaic string according to an example of the present invention.
Figures 19, 20:
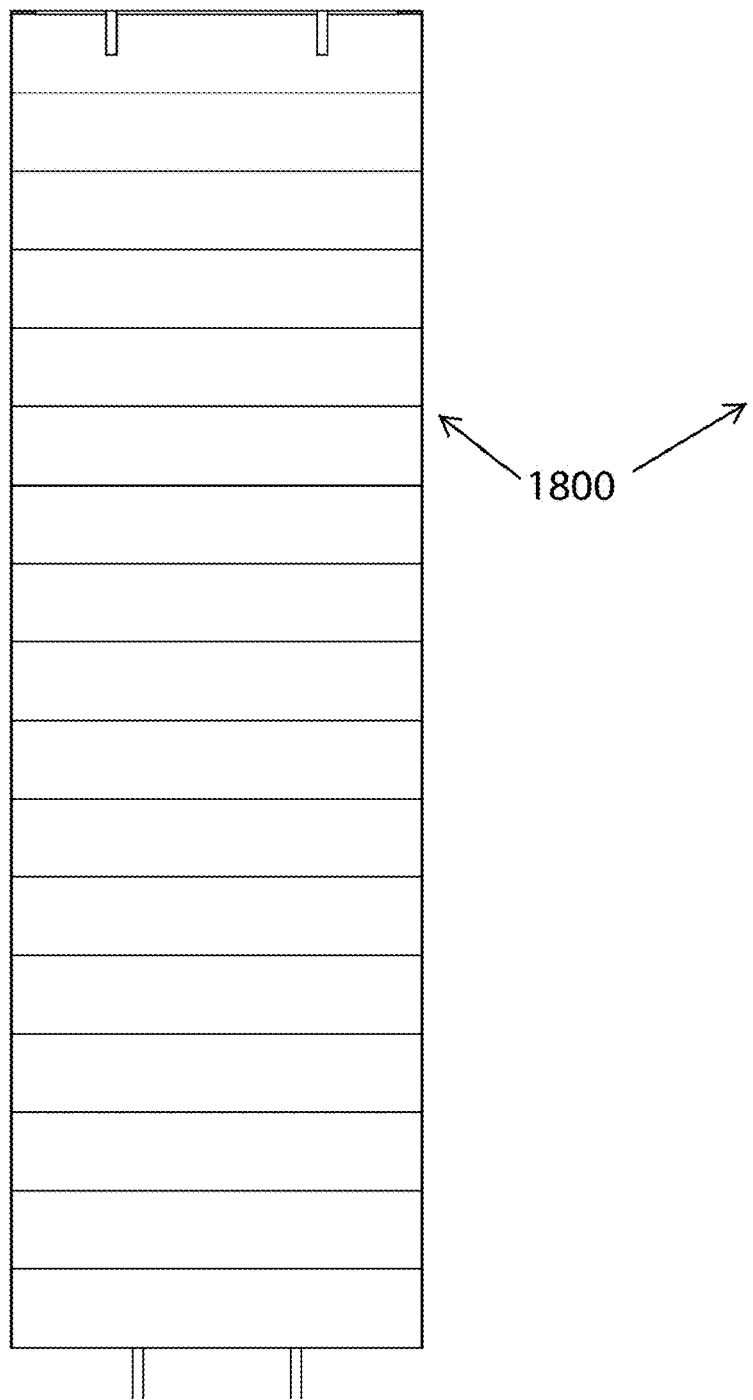
Figure 21:
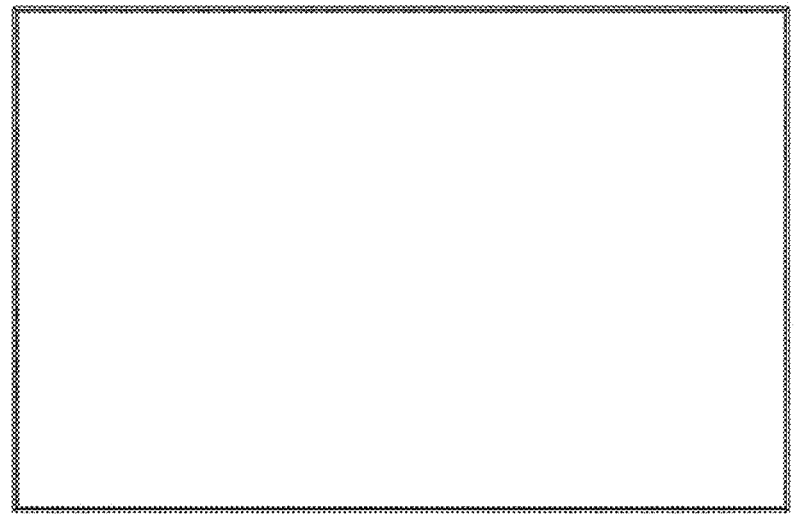
FIGS. 21-25 illustrate a solar module according to an example of the present invention.
Figure 22:
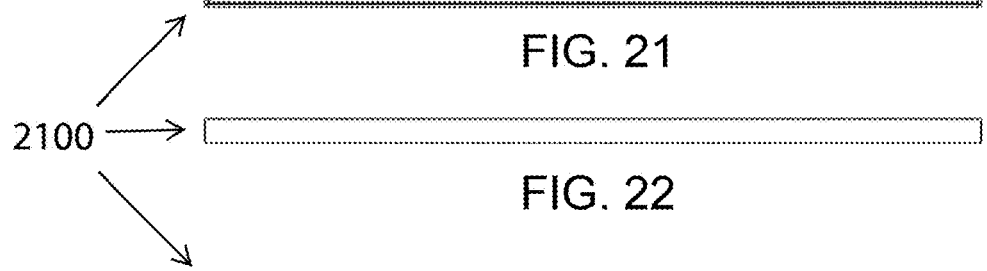
Figure 23:
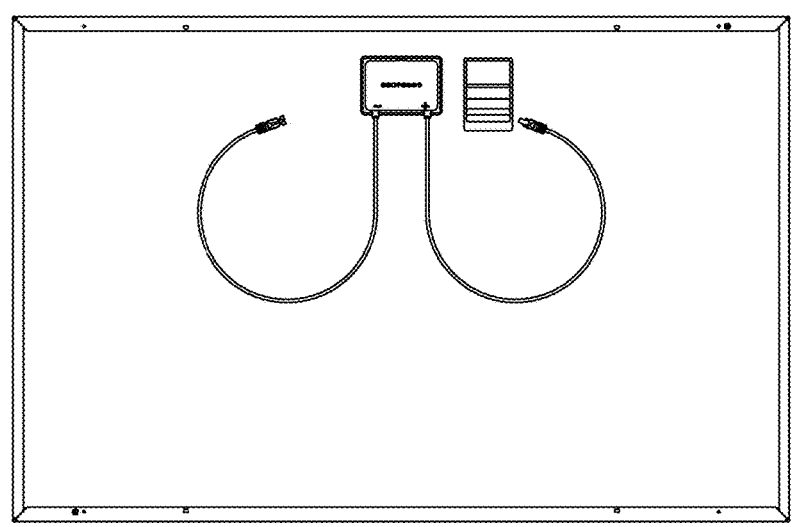
Figure 24:
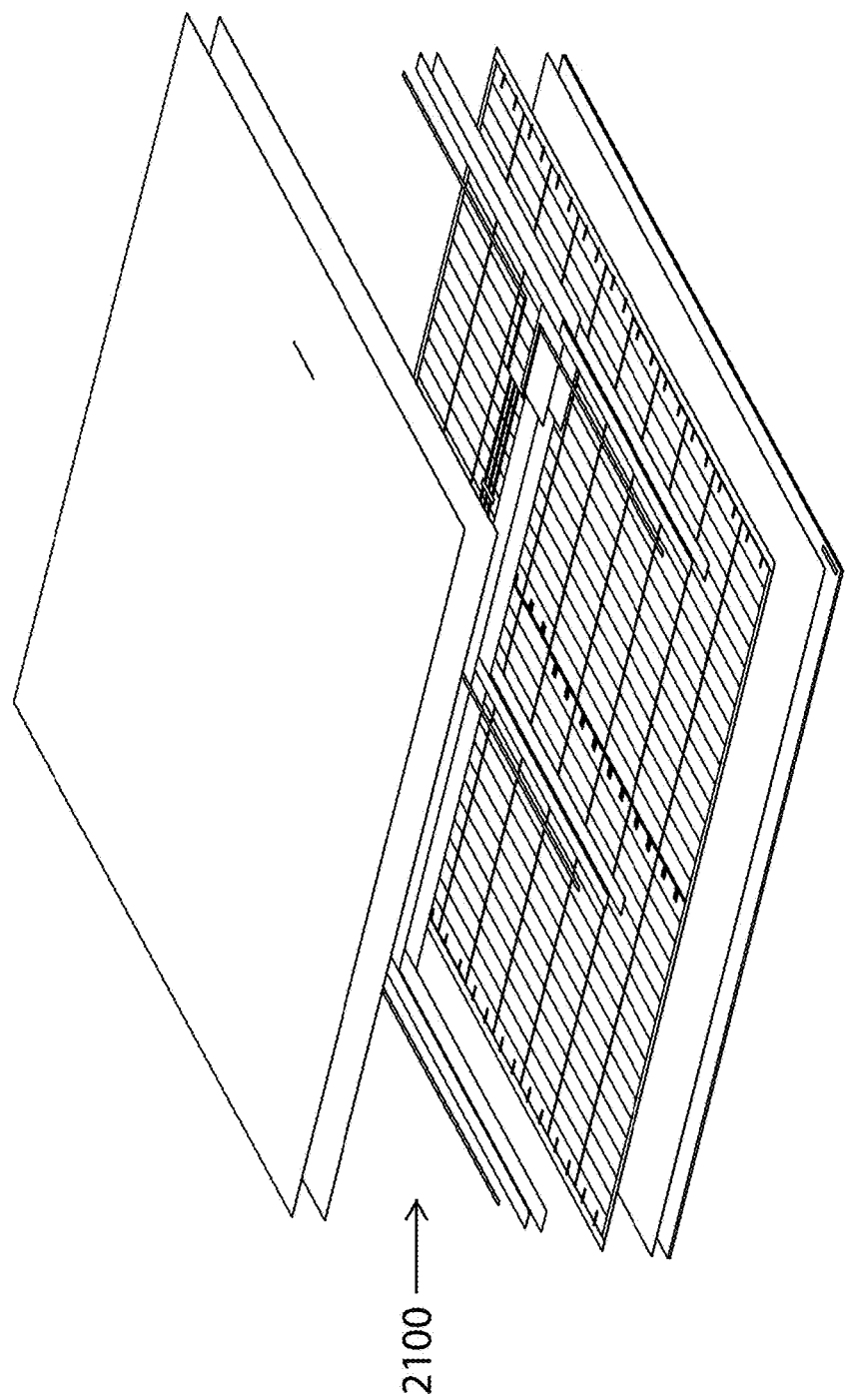
Figure 25:
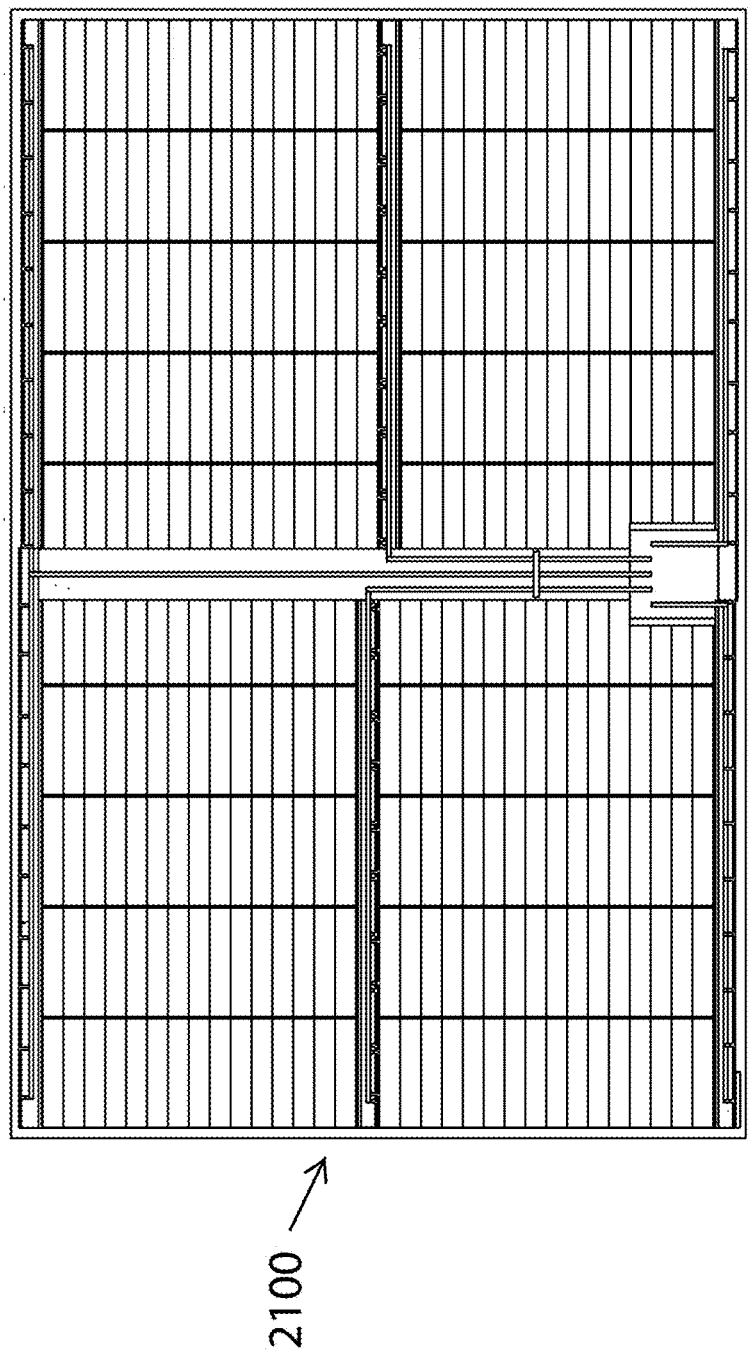

FIGS. 18-20 illustrate a photovoltaic string 1800 according to an example of the present invention.

FIGS. 21-25 illustrate a solar module 2100 according to an example of the present invention.

Figure 26:
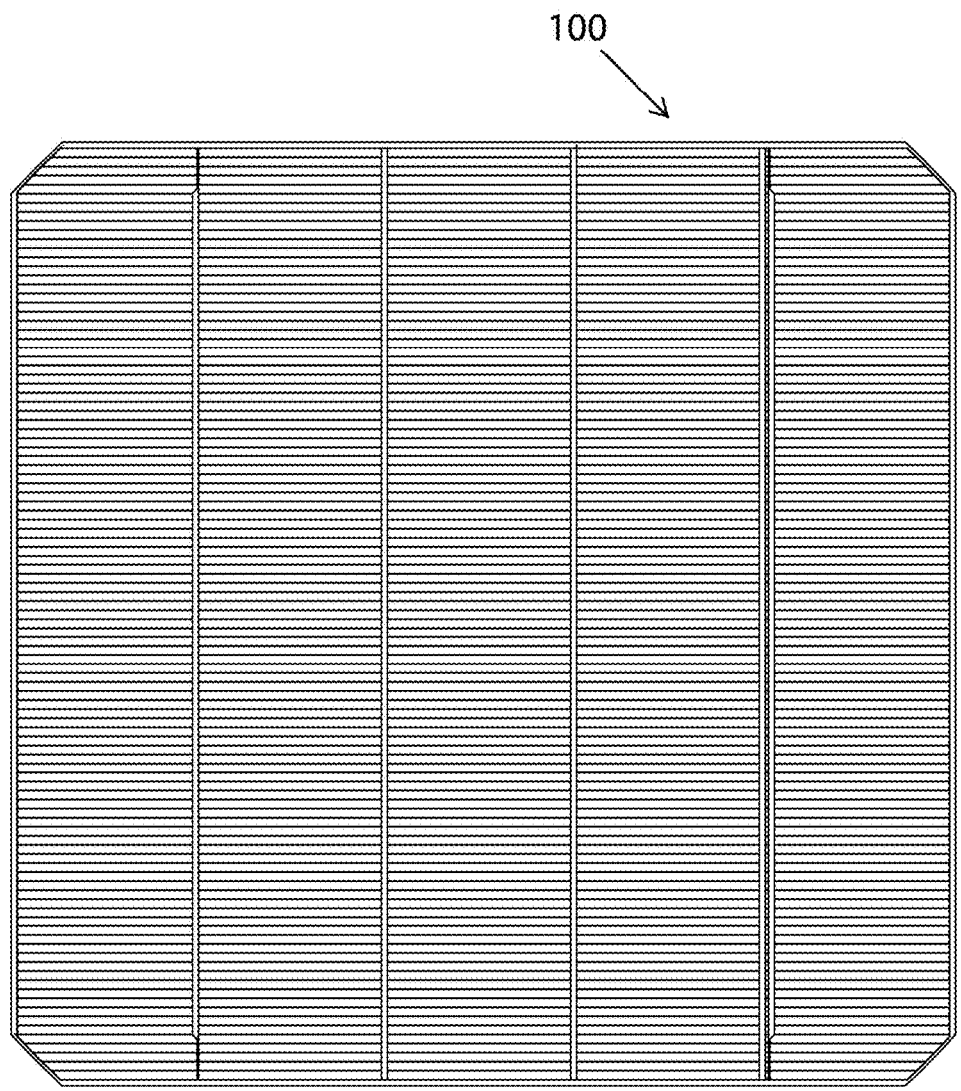
FIG. 26 is a front view of a solar cell in an example of the present invention.

FIG. 26 is a front view of a solar cell 100 in an example of the present invention.

Figure 27:
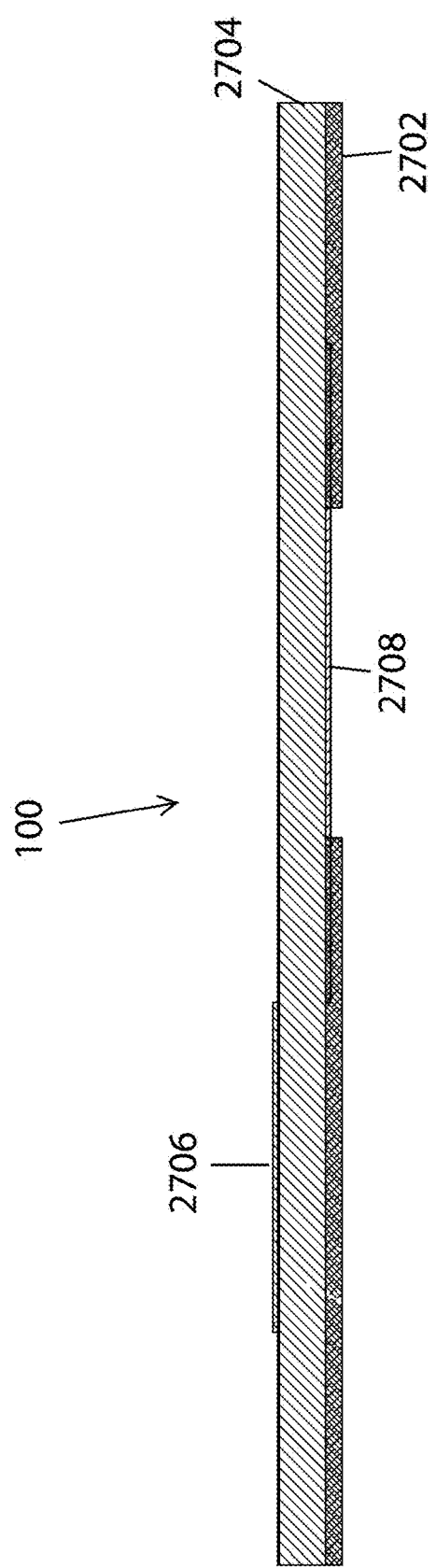
FIG. 27 is a side view of the solar cell, including bus bars, in an example of the present invention.

FIG. 27 is a side view of the solar cell 100, including bus bars, in an example of the present invention. The solar cell 100 includes a photovoltaic substrate 2704, a conductive backing material 2702, and metallized surfaces 2706 and 2708.

Figure 28:
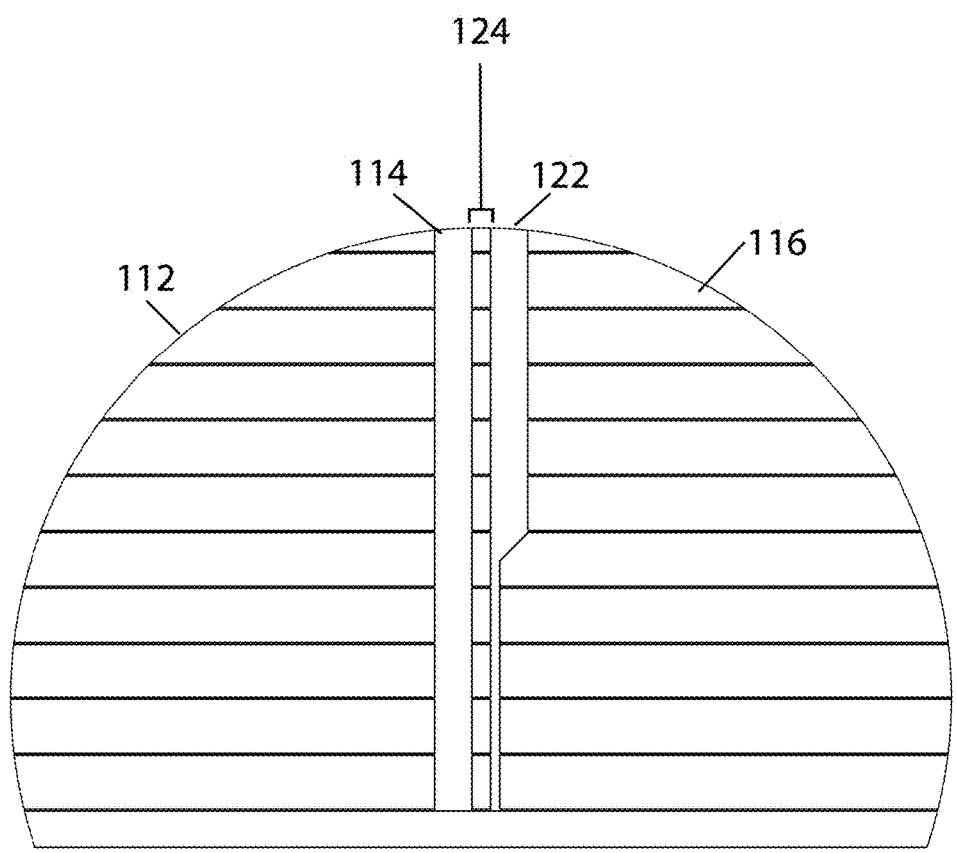
FIG. 28 is an expanded view of a bus bar in an example of the present invention.

FIG. 28 is an expanded view of a bus bar region of a solar cell 100 in an example of the present invention.

In an example, the present invention provides a method of manufacturing a solar module. The method includes providing a substrate member having a surface region. In an example, the substrate is a solar cell 100 as described in the present specification. The solar cell 100 is made of photovoltaic material, which has various features.

Features of FIG. 28 will be explained with respect to the numbering provided in FIG. 1. In an example, the surface region comprises a spatial region and a backside region, a first end strip 102 comprising a first edge region 104 and a first interior region 106 as provided on the spatial region. In an example, the first interior region 106 comprises a first bus bar 108, while the first edge region 104 on the spatial region has no bus bar, and a plurality of strips 112 as provided on the spatial region. In an example, each of the strips 112 has a bus bar 114 along an edge furthest away from the first bus bar 108, a second end strip 116 comprising a second edge region 118 and a second interior region 120, the second interior region 120 comprising a second bus bar 122 such that the second bus bar 122 and the bus bar 114 from one of the plurality of strips 112 forms a gap defining a scribe region 124, the second edge region 118 comprising no bus bar, the first end strip 102, the plurality of strips 112, and the second end strip 116 arranged in parallel to each other and occupying the spatial region such that the first end strip 102, the second end strip 116, and the plurality of strips 112 consists of a total number of five (5) strips 112, the backside region comprising the second end strip 116 comprising the second edge region 118, the second edge region 118 having a second backside bus bar 126 such that the second backside bus bar 126 and the second bus bar 122 are provided between photovoltaic material of the second end strip 116.

In an example, the method includes separating each of the plurality of strips 114. The method includes separating the first end strip 102, and separating the second end strip 116 by scribing via the scribe region 124 and removing the second end strip 116. Each of the separation processes can occur along a spatial direction of the substrate.

In an example, the method includes transferring the first end strip 102 in a first magazine, transferring each of the plurality of strips 114 into a second magazine or a plurality of magazines, and transferring the second end strip 116 into a second magazine. In an example, the method includes selecting each of the plurality of strips 114, and arranging the plurality of strips in a string configuration. The method then includes using the string in a solar module.

In an example, a substrate member comprises a silicon material, a backside region further comprising a first backside bus bar on a first end strip, and a plurality of bus bars respectively formed on the plurality of strips.

In an example, the substrate member has a dimension of 156 mm plus or minus about two mm, but other embodiments are possible.

In an example, each of the strips has a desired width to be assembled in the string configuration.

In an example, the plurality of strips are monolithically connected with each other. In an example, each of the plurality of strips has an apert region. Further details of the present invention can be found throughout the present specification and more particularly below.

Figure 29:
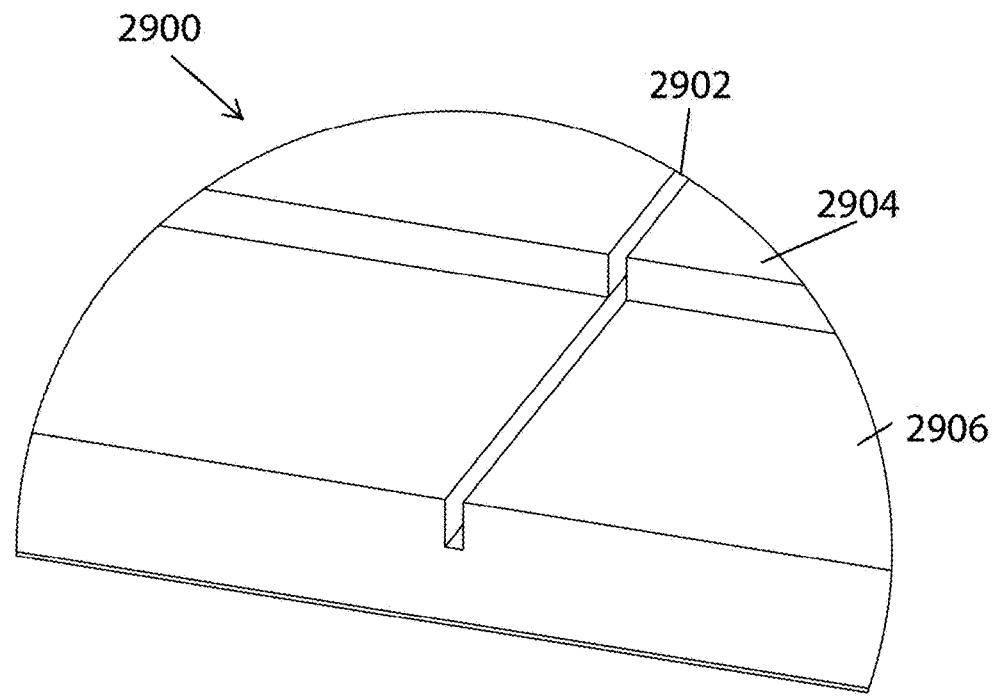
FIGS. 29-33 illustrate a solar cell under a cut and separation process according to an example of the present invention.
Figure 30:
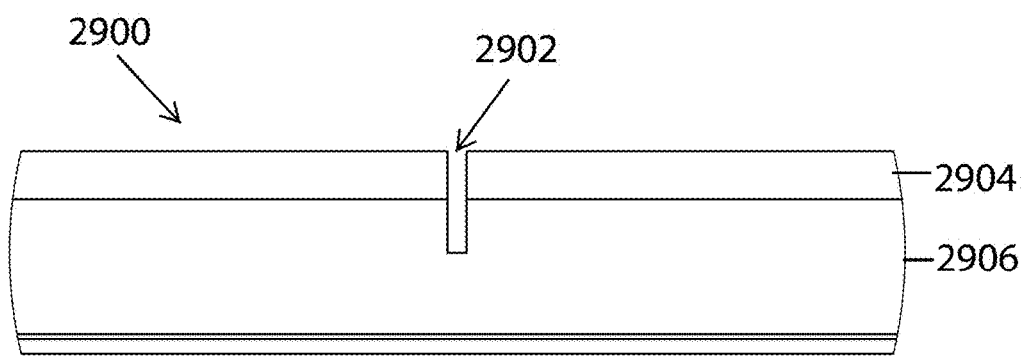

FIGS. 29-33 illustrate a solar cell 100 under a cut and separation pros according to an example of the present intion. FIGS. 29 and 30 are isometric and front views that show a ibe region 2900 of a solar cell, including a kerf 2902 that is cutrough a backing material 2904 aa photovoltaic material 29

Figure 31:
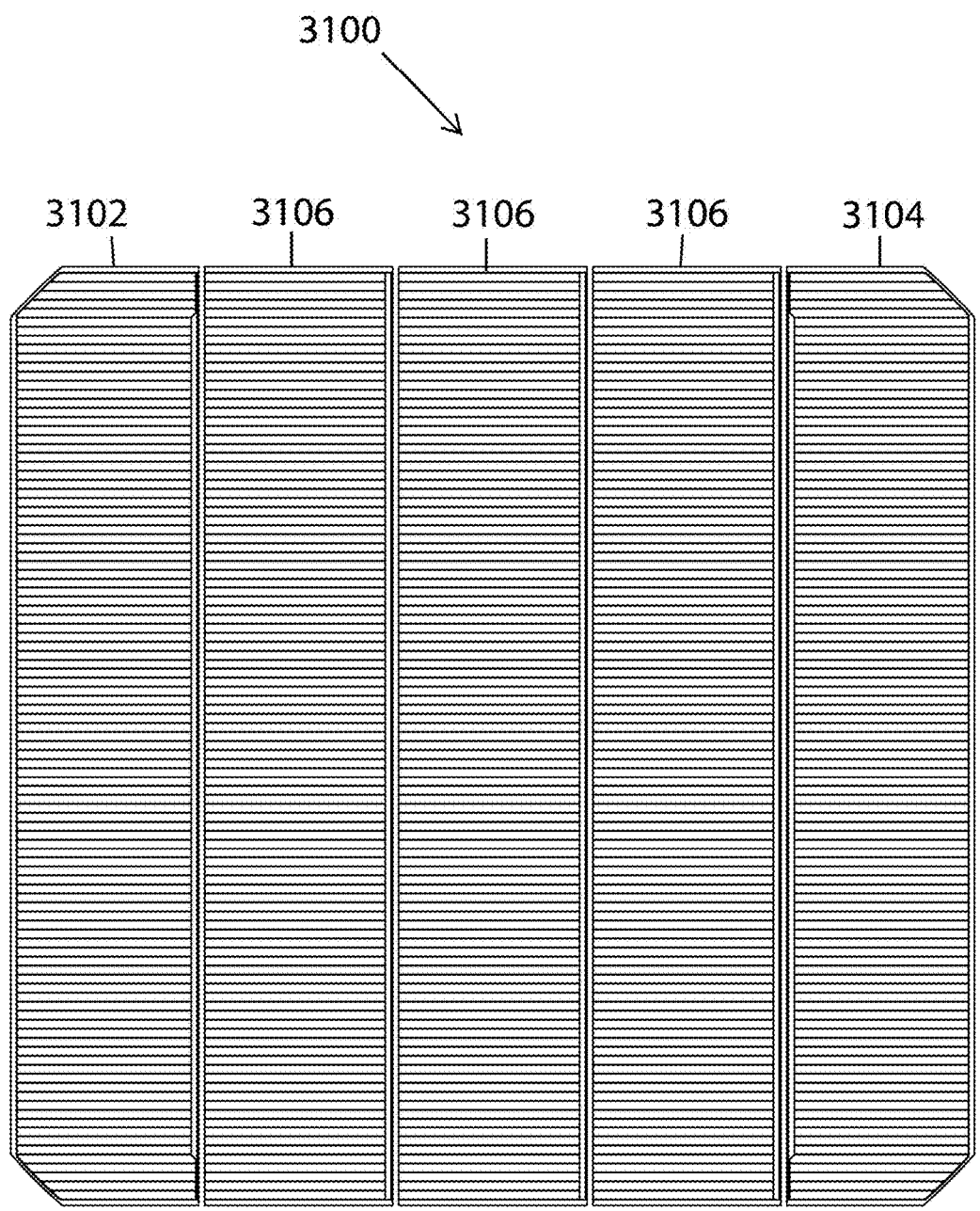
Figure 32:
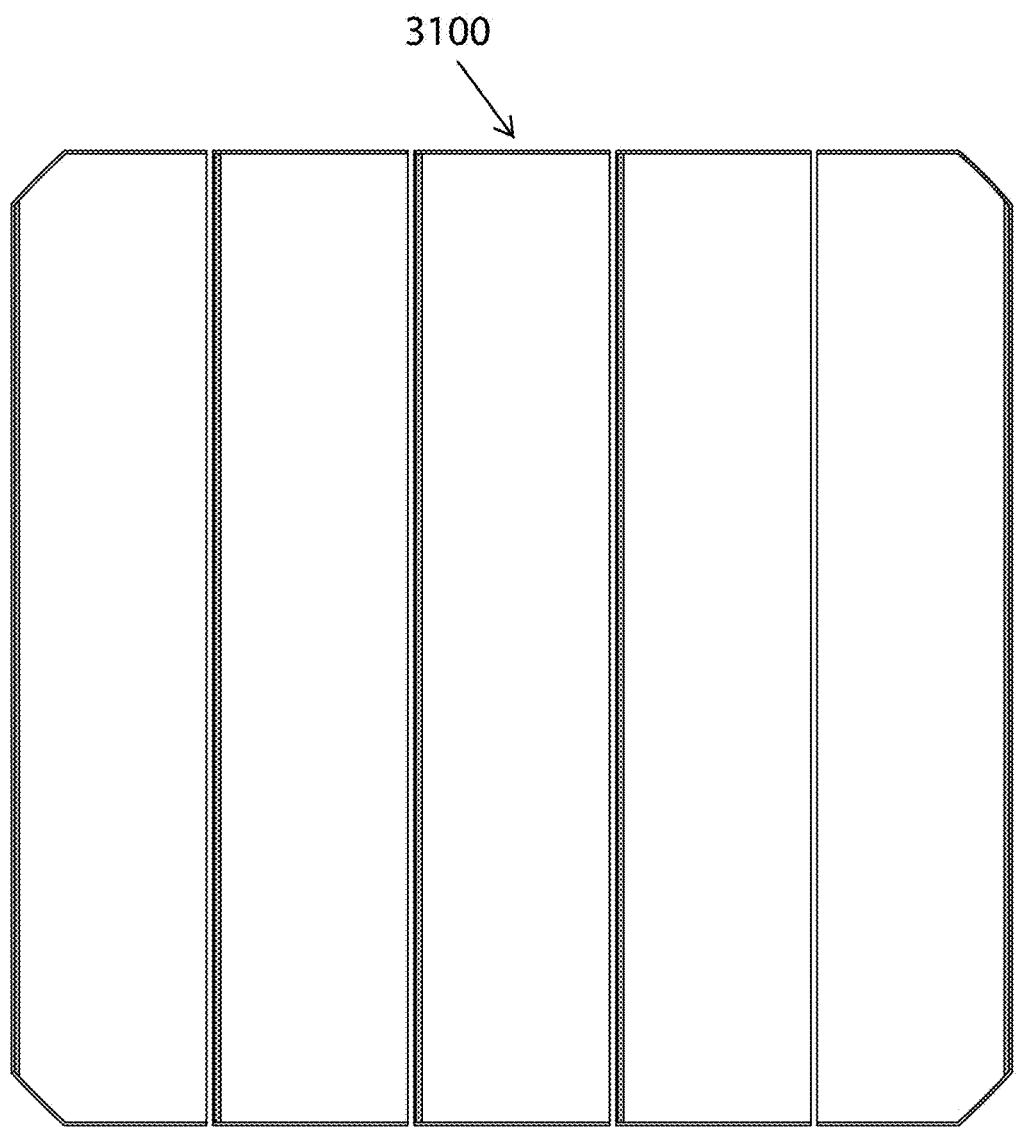
Figure 33:
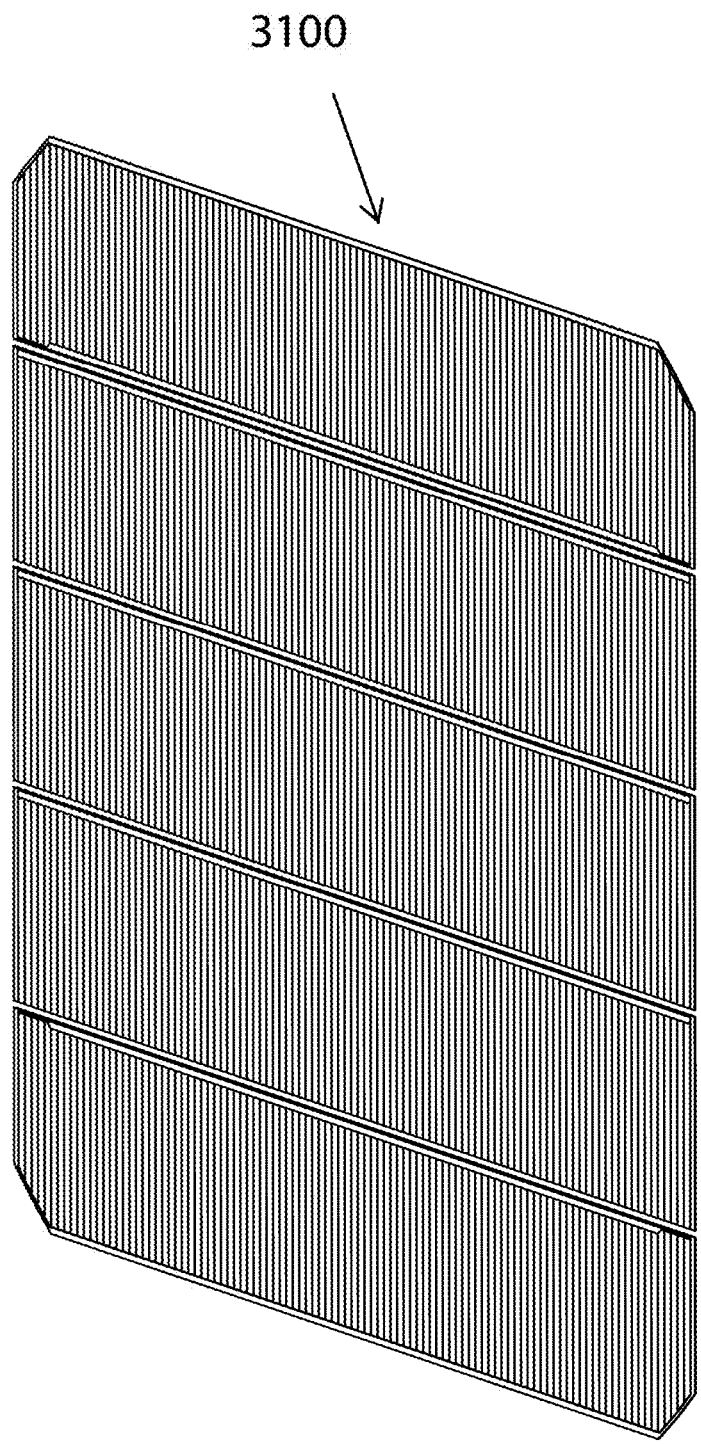

FIG. 31 shows a cell 3100 that has been subjected to a separation process. The separated cell 3100 includes a first edge strip 3102, a second edge strip 3104, and three strips 3106 from middle portions of the cell. FIG. 32 shows a backside view of the separated cell 3100, and FIG. 34 shows an isometric view of the separated cell 3100.

Figure 34:
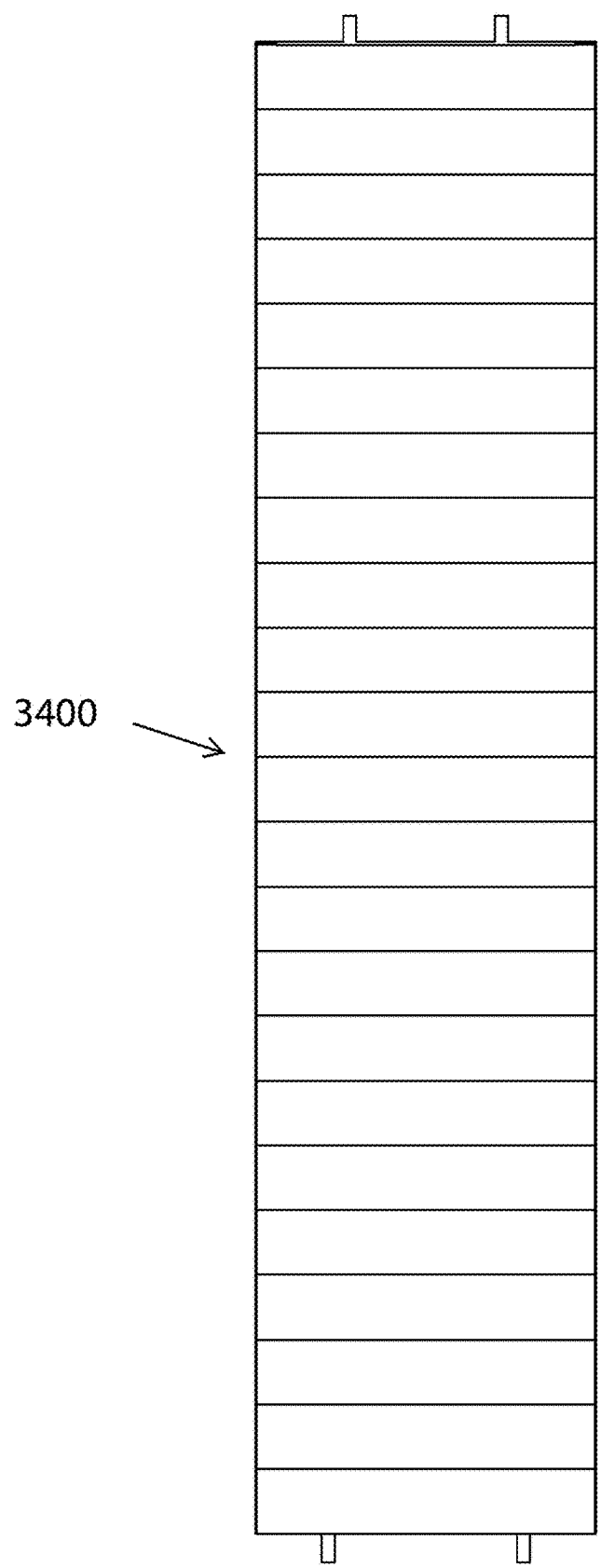
FIG. 34 is a top view of a photovoltaic string according to an example of the present invention.

FIG. 34 is a top view of a photovoltaic string 3400 according to an example of the present invention.

Figure 35:
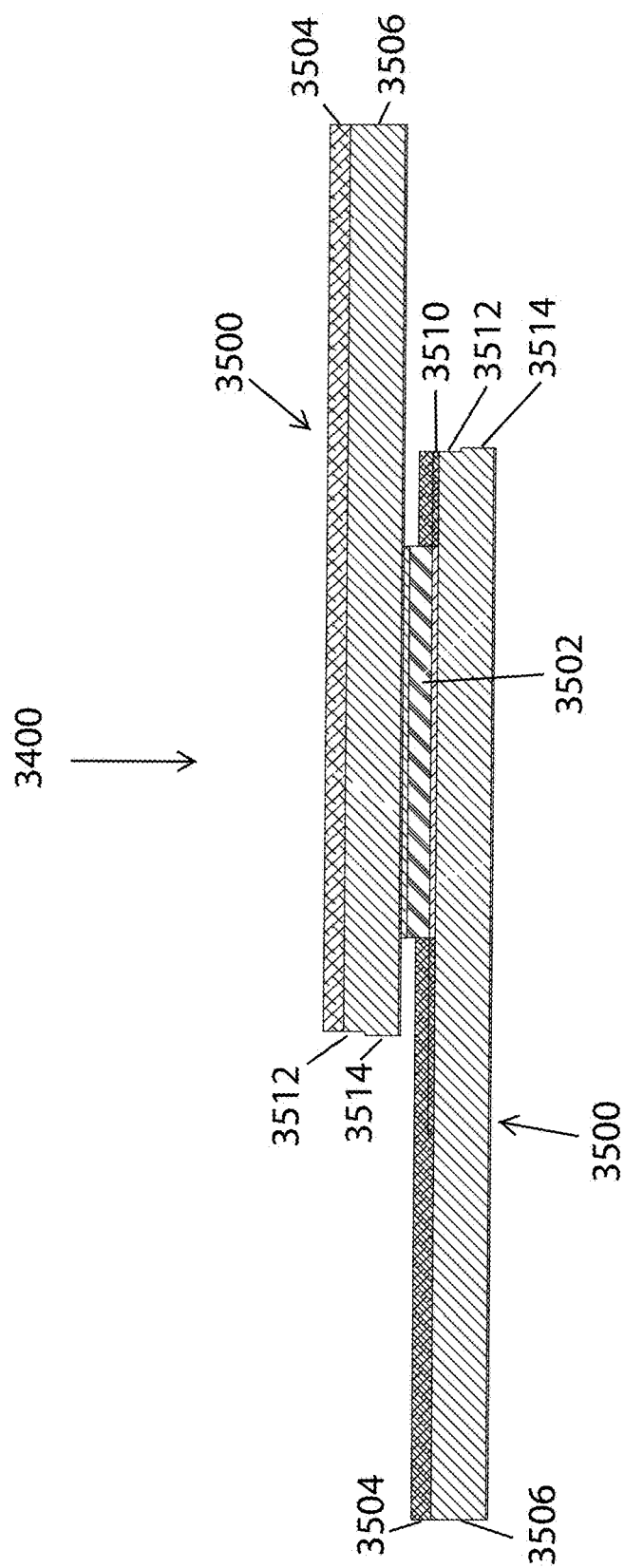
FIG. 35 is a side view of the photovoltaic string according to an example of the present invention.

FIG. 35 is a side view of the photovoltaic string 3400 according to an example of the present invention focused on a cell to cell overlap in the string. The photovoltaic string includes a plurality of strips 3500 that are bonded together by an ECA layer 3502. Each strip comprises a backing material 3504, which may be a thickness of aluminum, and a photovoltaic material 3506. The ECA 3502 is bonded between a conductive metallized layer 3510, which may be a bus bar, that is disposed between the backing material 3504 and the photovoltaic material 3506. The exposed ends of the strips 3500 show a kerf 3512 and a fracture plane 3514 from a scribing and singulation process.

Figure 36:
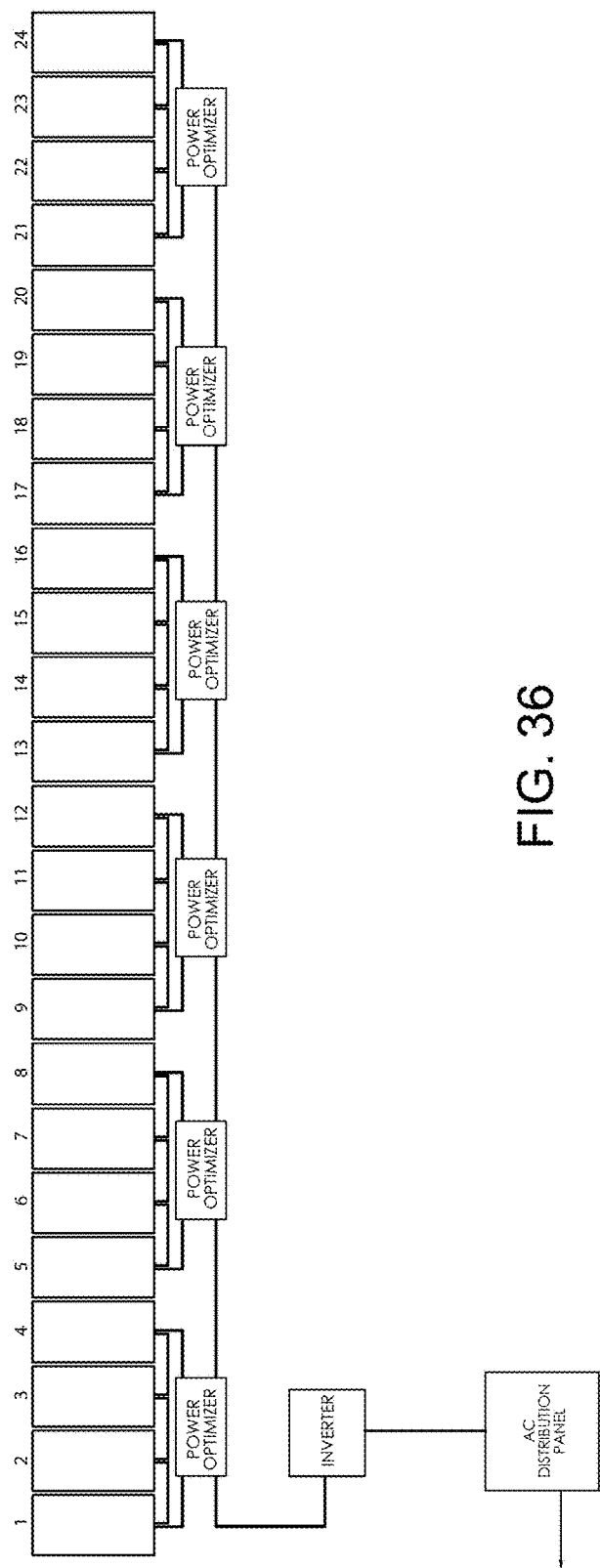
FIG. 36 is a simplified diagram of a system according to an example of the present invention.

FIG. 36 illustrates a simplified system diagram according to an example of the present invention showing 24 modules connected to power optimizers that feed into an inverter and then out to the grid.

In an example, the present method and system utilizes a $1/5^{th}$ strip width versus $1/3^{rd}$, $1/4^{th}$ or $1/6^{th}$ of a cell strip width based upon unexpected benefits and/or results, as shown in the table below.

have lower voltage and higher current for the solar tracking applications, and to have higher voltage and lower current for residential modules that interface with module power electronics.

In an example, the present method and design uses a 31.2 mm strip width, which optimizes module characteristics, as well as providing a current and voltage similar to standard modules. This allows embodiments to take advantage of standard inverters, electronics, and mechanical features.

Figure 37:
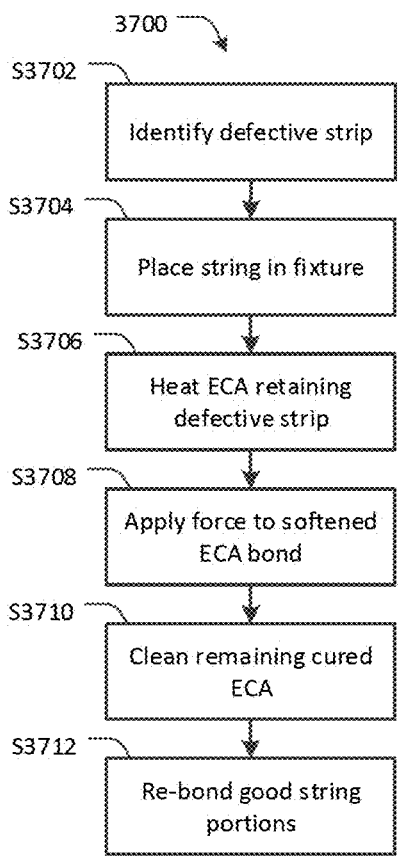
FIG. 37 illustrates a process for replacing a strip in a string according to an example of the present invention.

An example of a process 3700 for replacing a photovoltaic strip in a string comprising a plurality of strips will now be explained with respect to FIG. 37. In a first step S3702, a defective strip is identified in an assembled string. The defective strip may be identified by applying current to the string and observing infra-red emissions from each of the strips in the string.

Figure 38:
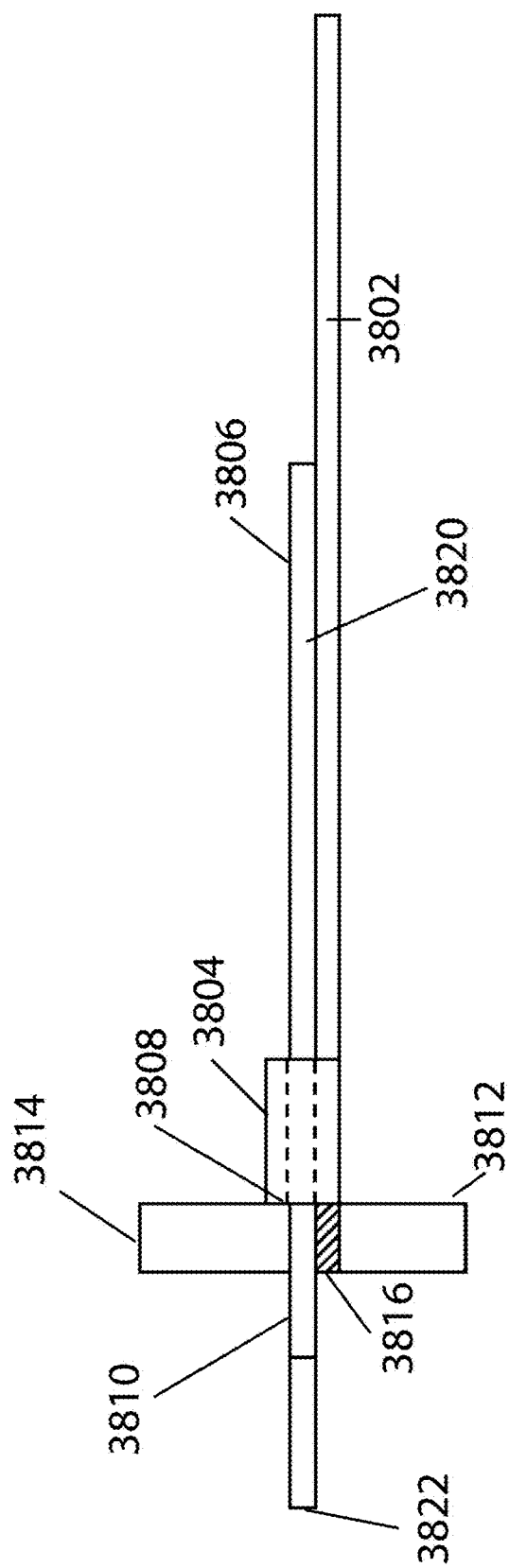
FIG. 38 illustrates a separation device for separating a defective strip from a string according to an example of the present invention.
Figure 41:
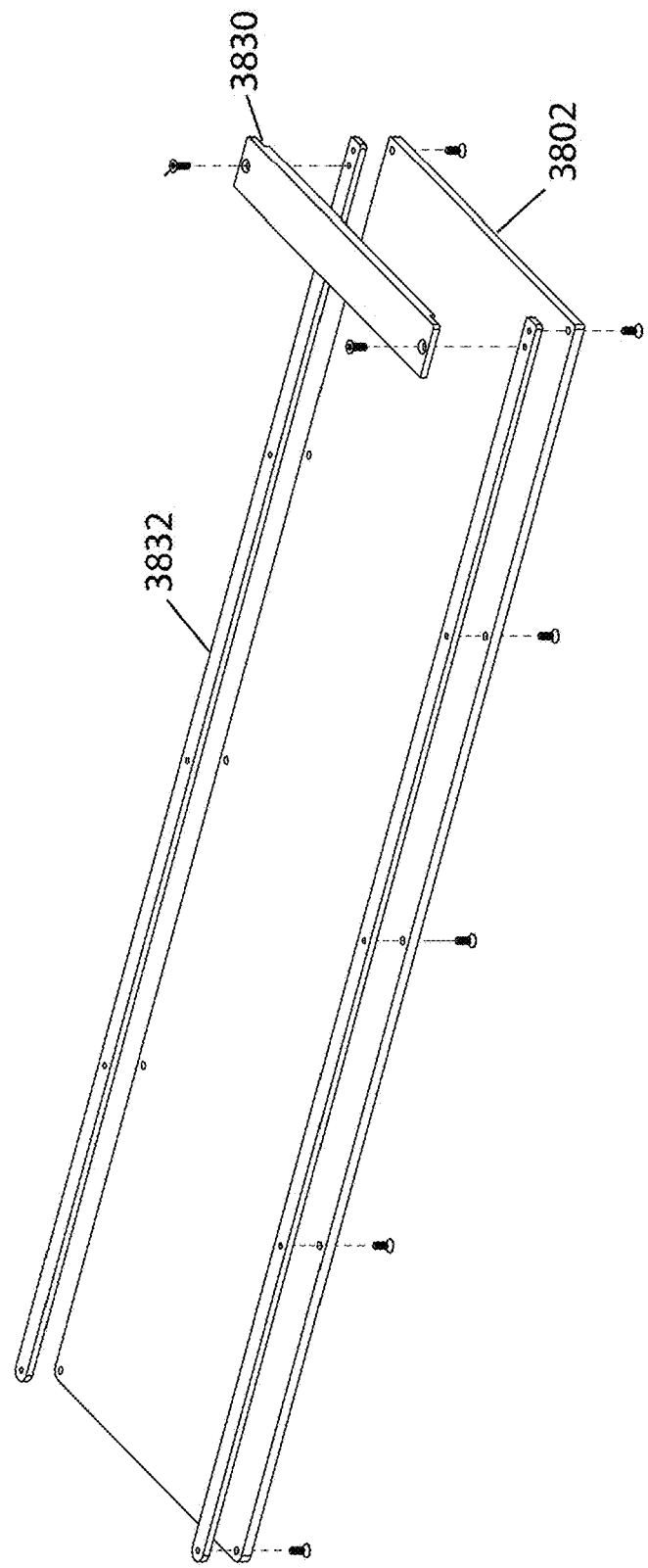
FIGS. 41 and 42 illustrate elements of a separation device according to an example of the present invention.
Figure 42:
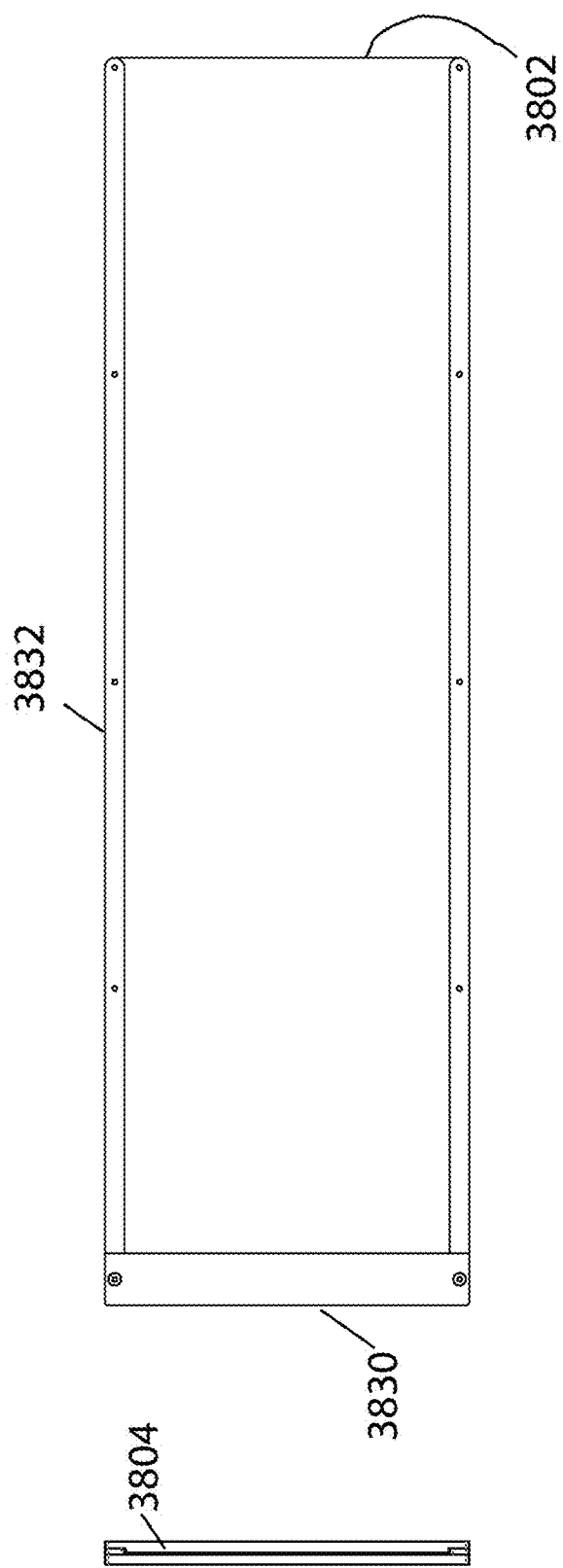

A string with a defective strip is placed into a fixture 3800 at S3704. In an embodiment, as seen in FIG. 38, the fixture 3800 includes a base portion 3802 and an orifice 3804 that are configured to accommodate a string 3806. The string 3806 is placed on the base portion 3802, and is moved forwards through the orifice 3804, which is disposed at an end of the base portion, so that a joint 3808 that bonds a defective strip 3810 is exposed by the orifice. Portions of the fixture are illustrated in more detail in FIGS. 41 and 42, which show the base portion 3802 that is assembled with an end bar 3830 and side rails 3832. A gap between the end bar 3830 and the base portion 3802 defines the orifice 3804.

Heat is applied to the joint 3808 at S3706 to soften the ECA that provides an adhesive bond at the joint. In an embodiment, heat is applied by placing the joint 3808 between a lower block 3812 and an upper block 3814, and one or both of the upper and lower blocks may include a heating element 3816. When heat is applied to the joint 3808, care may be taken to prevent good strips from being exposed to heat. In particular, the string 3806 may be positioned so that the heated blocks 3812 and 3814 are in physical contact with the defective strip 3810, but are not in

|  | PV Width | | | | | Comment |
|---|---|---|---|---|---|---|
| Width | 78 | 52 | 39 | 31.2 | 26 | mm |
| Cell Current | 4.5 | 3 | 2.25 | 1.8 | 1.5 | Isc = 9A standard cell |
| Fingers | 80-200 | 80-150 | 80-120 | 80-100 | 80 | (Microns) Based on standard cell finger |
| Shading | 7.0% | 5.8% | 5.0% | 4.5% | 4% | Finger shading |
| Cell Utilization | 98.7% | 97.4% | 96.2% | 94.9% | 93.6% | 2 mm overlap |
| Placements | 2X | 3X | 4X | 5X | 6X | Over standard module |
| Fill Factor | 76% | 77% | 78% | 79% | 79% | |

In the table, width refers to the width of a strip after it has been cut from a cell. Current is the amount of current that a strip produces, which is directly proportional to the size of the strip. Fingers carry current across a strip, while shading is the area of the strip shadowed by the fingers. Cell utilization is the amount of area in a string in which strips do not overlap one another. The number of placements is how many strips are cut from a cell and placed in a string. Fill factor is the efficiency of the photovoltaic material present in a string compared to its maximum power producing potential.

In an example, modules are configured to have current and resistance characteristics that are similar to a conventional module (Voc, Vmp, Isc, Imp, Power). However, modules can be designed to have different characteristics for different applications. For example, modules created according to embodiments of this disclosure can be configured to physical contact with, or are in minimal physical contact with good strips of the string.

The joint 3808 may be retained between the upper and lower blocks for a predetermined time at a predetermined temperature to soften the ECA holding the joint 3808 together. In an embodiment, the predetermined temperature is between 150 and 300 degrees Celsius. In another embodiment, the predetermined temperature is between 150 and 250 degrees Celsius, while in still another embodiment the predetermined temperature is between 150 and 200 degrees Celsius.

When the ECA has been heated and softened, mechanical force is applied to the joint 3808 to separate the defective strip from non-defective portions of a string at S3708. In one embodiment, the mechanical force is applied by raising or lowering the end of the base 3802 that is farthest from the blocks, thereby applying a force moment to the joint 3808 and causing the softened joint 3808 to separate.

After the defective strip 3810 has been separated from the string 3806, if the defective strip is located at a far end of a string, then the process may proceed to step S3710. However, if the defective strip 3810 is located in a middle part of the string 3806, then the remaining portion of the string to which the defective strip is still bonded, e.g. a second string portion 3822, is placed on the base 3802, and steps 3706 and 3708 are performed on the remaining joint 3808 attaching the defective strip. When this process is completed, the defective strip 3810 is completely separated from non-defective strips, and can be disposed of.

In another embodiment, the second string portion 3822 is first separated from the defective strip 3810 by performing steps S3704 to S3708 so that the defective strip 3810 remains attached to the first string portion 3802, and the defective strip 3810 is then removed from the first string portion 3802 by repeating steps S3704 to S3708.

After the defective strip 3810 has been removed, parts of the cured ECA that remain on exposed edges of non-defective portions the strip are removed at S3710. The cured ECA may be removed by a solvent, a mechanical instrument, or a combination of the two. For example, the ECA may be removed by applying a solvent that attacks the ECA to an applicator such as a fiber bundle or a porous polymer, and applying the applicator to the remaining ECA.

The first string portion 3820, which comprises non-defective strips, is then re-bonded to one or more non-defective ("good") strip to create a string that does not have any defective strips in a process 3900. In one embodiment, as defective strips are removed from strings, the remaining portions of the strings having non-defective strips are accumulated and re-assembled to create replacement strings. For example, if strings consisting of 7 strips are desired, then string portions of 3 and 4 strips may be accumulated as defective strips are removed, and these remaining string portions may be re-bonded to one another with ECA. In another example, when a single defective strip is removed, that strip is replaced using the one or more good string portion that remains after the defective strip has been removed. In other words, defective strips can be replaced directly with a good strip, or the remaining good string portions can be retained and re-assembled.

Figure 39:
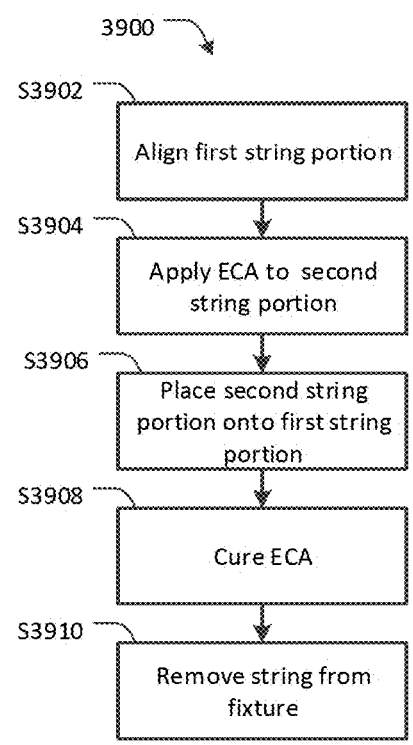
FIG. 39 illustrates a process for re-assembling a string after one or more defective strip has been removed from the string according to an example of the present invention.

FIG. 39 illustrates an example of a process 3900 for re-assembling a string after one or more defective strip has been removed from the string. A first string portion comprising non-defective strips is aligned in a fixture at S3902.

Figure 40:
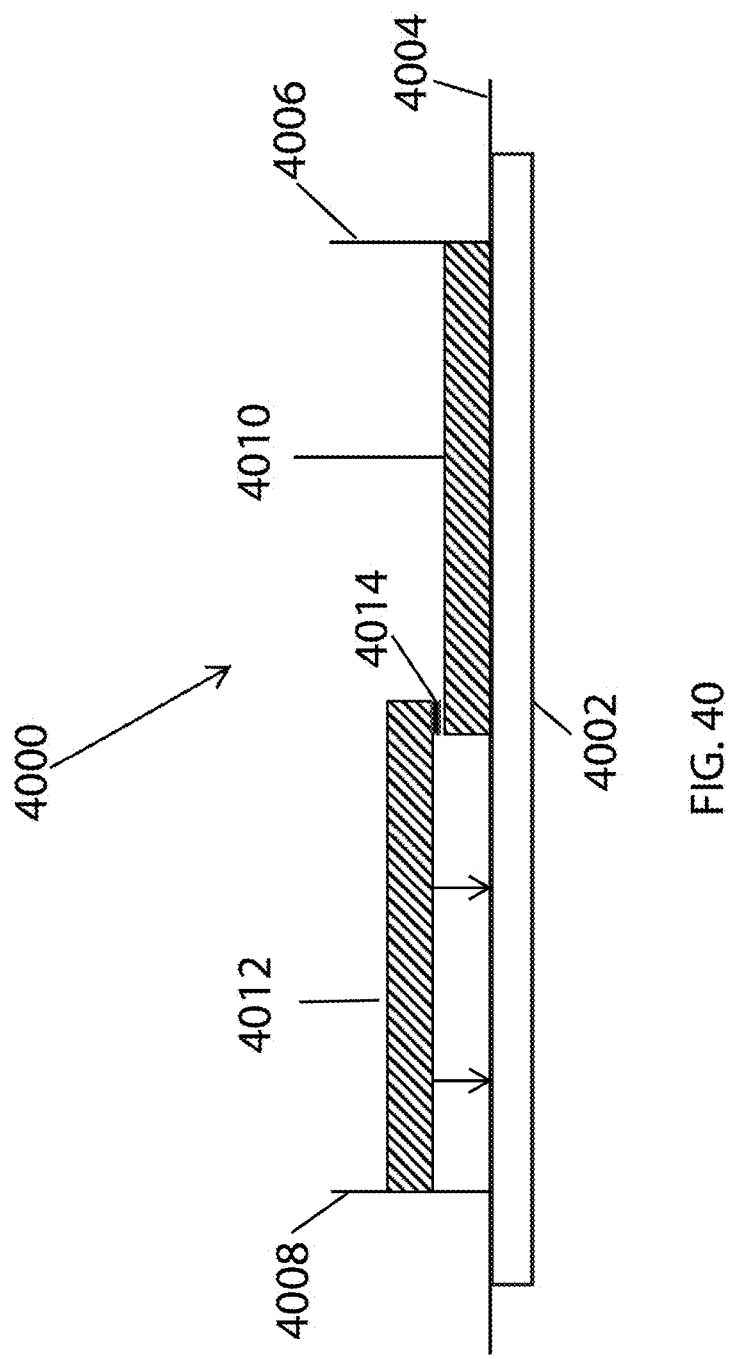
FIG. 40 illustrates a fixture for re-assembling a string after one or more defective strip has been removed according to an example of the present invention.

FIG. 40 illustrates an example of a cross-section of a fixture 4000 for re-assembling a string after one or more defective strip has been removed. The fixture 4000 includes a base 4002, a tray 4004 that may be removable from the base, a first end guide 4006, and a second end guide 4008.

A first string portion 4010 is aligned with the fixture 4000 by placing it against the first end guide 4006 at S3902. Subsequently, uncured ECA 4014 is applied to an edge of the second string portion 4012 that will be overlapped with and bonded to a corresponding edge of the first string portion 4010.

After the ECA 4014 has been applied to the second string portion 4012, the second string portion 4012 is aligned to the first string portion 4010 by placing it against the second end guide 4008, and is lowered onto the first string portion 4010. Although not shown in the cross-sectional view, the fixture 4000 may include side guide members to align sides of the strings.

Subsequently, the ECA 4014 is cured by applying thermal energy to the joint at S3908. After the ECA 4014 is cured, the finished string is removed from the fixture at S3910. The string may be removed by lifting tray 4004, which may be removably coupled to the fixture base 4002.

In an embodiment, one or more of the guide members protrudes through one or more corresponding slot in tray 4004. In one example, at least one of the guide members is attached to the base 4002, while at least one other guide member is attached to the tray 4004.

One or more of the guide members may be, for example, a rail, a wire, a column with a cylindrical, rectangular, or other polygonal cross-section, etc. In some embodiments, no tray is present, or one or more side of the tray may be disposed within the guide members so that no or few slots are present in the tray. Persons of skill in the art will recognize that numerous specific embodiments of the guide, base and tray elements of the alignment fixture 4000 are possible.

In an example, the present invention provides a method of manufacturing a solar module apparatus. The method includes providing a photovoltaic string, the photovoltaic string comprising a plurality of strips from 2 to 45, each of the plurality of strips being configured in a series arrangement with each other, each of the plurality of photovoltaic strips having a substantially similar width and substantially similar length, the photovoltaic string comprising a first bus bar and a second bus bar, each of the plurality of strips being configured using an electrically conductive adhesive (ECA) material to another one of the plurality of strips to mechanically connect the plurality of strips together. The method includes applying DC power to the first bus bar and the second bus bar to initiate an emission of electromagnetic radiation from each of the photovoltaic strips. The method includes capturing an image of the photovoltaic string to identify at least one of the photovoltaic strips that has a darker image to identify a defective photovoltaic strip. The method includes applying thermal energy to the ECA material to change a state of the ECA material to release the ECA material from a pair of the photovoltaic strips to remove the damaged photovoltaic strip and removing any residual ECA material from the good photovoltaic strip(s) adjacent that was adjacent to the damaged photovoltaic strip. The method includes aligning the photovoltaic string without the damaged photovoltaic strip, and a replacement photovoltaic strip that replaces the damaged photovoltaic strip; and curing a reapplied ECA material on the replacement photovoltaic strip to provide the photovoltaic string with the replacement photovoltaic strip.

In an example, the aligning comprises aligning a first portion of the photovoltaic string to an alignment member; applying the ECA material on the first portion of the photovoltaic string; aligning the replacement photovoltaic strip to the first portion of the photovoltaic string; applying the ECA material on the replacement photovoltaic strip; aligning a second portion of the photovoltaic string to the replacement photovoltaic strip; and thereafter performing the curing of the reapplied ECA material.

In an example, the DC power comprises a voltage ranging from 10 to 50 Volts and a current ranging from 0.5 to 10 Amps.

In an example, the ECA material is an electrically conductive adhesive.

In an example, the thermal energy is provided by conduction, convection, or radiation to a temperature ranging from 180 to 300 Degrees Celsius.

In an example, the method is a repair process.

In an example, each of the photovoltaic strips is derived from separating a solar cell into five strips of similar size and shape.

In an example, the damaged photovoltaic strip has a defect consisting of at least one of a crack, a broken section, a bad electrical interconnect, a defective photovoltaic material, or a short or open circuit.

In an example, the image is captured in an electromagnetic radiation range including infra-red.

In an example, the good photovoltaic strip emits a substantially even image that has been captured and is homogeneous along an entirety of a surface region of the good photovoltaic strip.

In an example, the photovoltaic string is configured with a plurality of photovoltaic strings in a module before a lamination process.

In an example, the thermal energy is provided selectively to localize heat to the EVA material, while maintaining other portions of the strip substantially free from thermal energy.

In an example, one or more of the steps can occur automatically or continuously from step to step.

While the above is a complete description of specific embodiments of the invention, the above description should not be taken as limiting the scope of the invention as defined by the claims.

It is understood that the examples and embodiments described herein are for illustrative purposes only and that various modifications or changes in light thereof will be suggested to persons skilled in the art and are to be included within the purview of this application and scope of the appended claims.

The invention claimed is:

1. A method of manufacturing a solar module apparatus comprising:
    providing a photovoltaic string, the photovoltaic string comprising a plurality of from 2 to 45 strips, each of the plurality of strips being configured in a series arrangement with each other, each of the plurality of photovoltaic strips having a substantially similar width and substantially similar length, the photovoltaic string comprising a first bus bar and a second bus bar, each of the plurality of strips being coupled to another one of the plurality of strips using an electrically conductive adhesive (ECA) material to mechanically connect the plurality of strips together;
    detecting the presence of at least one defective strip in the photovoltaic string;
    applying thermal energy to the ECA material to change a state of the ECA material to release the ECA material from a pair of the photovoltaic strips to remove the defective photovoltaic strip;
    removing any residual ECA material from one or more good photovoltaic strip that was adjacent to the defective photovoltaic strip in the string;
    aligning the photovoltaic string without the defective photovoltaic strip, and a replacement photovoltaic strip that replaces the defective photovoltaic strip; and
    curing a reapplied ECA material on the replacement photovoltaic strip to provide the photovoltaic string with the replacement photovoltaic strip.

2. The method of claim 1 wherein the aligning comprises: aligning a first portion of the photovoltaic string to an alignment member;
    applying the ECA material on the replacement photovoltaic strip;
    aligning a second portion of the photovoltaic string to the replacement photovoltaic strip; and
    curing the reapplied ECA material.

3. The method of claim 1, wherein the ECA material is a thermosetting acrylate adhesive.

4. The method of claim 3, wherein the ECA material is a heat cured adhesive that is loaded with conductive metal particles.

5. The method of claim 1 wherein the thermal energy is provided by conduction, convention, or radiation to a temperature ranging from 150 to 300 degrees Celsius.

6. The method of claim 5, wherein the thermal energy is provided by conduction using a heat source that is heated to from 150 to 250 degrees Celsius.

7. The method of claim 1, wherein each of the photovoltaic strips is derived from separating a solar cell into five strips of similar size and shape.

8. The method of claim 1, wherein the defective photovoltaic strip has a defect consisting of at least one of a crack, a broken section, a bad electrical interconnect, a defective photovoltaic material, or short or open circuit.

9. The method of claim 1, wherein detecting the presence of the at least one defective strip includes:
    applying DC power to the first bus bar and the second bus bar to initiate an emission of electromagnetic radiation from each of the photovoltaic strips;
    capturing an image of the photovoltaic string to identify at least one of the photovoltaic strips that has a darker image and therefore a defective photovoltaic strip than a good photovoltaic strip to identify the defective photovoltaic strip.

10. The method of claim 9, wherein the image is captured in an electromagnetic radiation range including infra-red.

11. The method of claim 10, wherein the good photovoltaic strip emits a substantially even image that has been captured and is homogeneous along an entirety of a surface region of the good photovoltaic strip.

12. The method of claim 9, wherein the DC power comprises a voltage ranging from 10 to 50 Volts and a current ranging from 0.5 to 10 Amps.

13. The method of claim 1, wherein the photovoltaic string is configured with a plurality of photovoltaic strings in a module before a lamination process.

14. The method of claim 1, wherein the thermal energy is provided selectively to localize heat to the ECA material, while maintaining other portions of the strip substantially free from thermal energy.

15. The method of claim 1, wherein, after the thermal energy is applied to the ECA, mechanical force is applied to a joint which is bonded by the ECA material to mechanically separate the defective strip from a portion of the string that includes non-defective strips.

16. The method of claim 14, wherein the portion of the string that includes non-defective strips is retained in a fixture, and the defective strip is exposed by an orifice of the fixture.

17. The method of claim 15, wherein the thermal energy is applied to the joint by placing the joint in contact with a heated structure.

18. The method of claim 14, wherein the mechanical force is a force moment that is applied by rotating the portion of the string that includes non-defective strips relative to the defective strip.

19. The method of claim 1, wherein the replacement strip is an end strip of a second string portion comprising a plurality of non-defective strips.

20. The method of claim 1, wherein the ECA bonds an upper surface of a first string to a backside surface of a second string in an overlapped joint.

* * * * *